(12) United States Patent
Sasagawa et al.

(10) Patent No.: US 7,711,239 B2
(45) Date of Patent: May 4, 2010

(54) MICROELECTROMECHANICAL DEVICE AND METHOD UTILIZING NANOPARTICLES

(75) Inventors: Teruo Sasagawa, Los Gatos, CA (US); Lior Kogut, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 290 days.

(21) Appl. No.: 11/407,730

(22) Filed: Apr. 19, 2006

(65) Prior Publication Data

US 2007/0247401 A1    Oct. 25, 2007

(51) Int. Cl.
- *G02B 6/00* (2006.01)
- *G02B 6/26* (2006.01)
- *G02B 6/42* (2006.01)

(52) U.S. Cl. .............................. 385/147; 385/16; 385/18
(58) Field of Classification Search ....................... None
See application file for complete search history.

(56) References Cited

U.S. PATENT DOCUMENTS

| | | | |
|---|---|---|---|
| 2,534,846 | A | 12/1950 | Ambrose et al. |
| 3,439,973 | A | 4/1969 | Paul et al. |
| 3,443,854 | A | 5/1969 | Weiss |
| 3,616,312 | A | 10/1971 | McGriff et al. |
| 3,653,741 | A | 4/1972 | Marks |
| 3,656,836 | A | 4/1972 | de Cremoux et al. |
| 3,725,868 | A | 4/1973 | Malmer, Jr. et al. |
| 3,728,030 | A | 4/1973 | Hawes |
| 3,813,265 | A | 5/1974 | Marks |
| 3,955,880 | A | 5/1976 | Lierke |
| 4,099,854 | A | 7/1978 | Decker et al. |
| 4,196,396 | A | 4/1980 | Smith |
| 4,228,437 | A | 10/1980 | Shelton |
| 4,377,324 | A | 3/1983 | Durand et al. |
| 4,389,096 | A | 6/1983 | Hori et al. |
| 4,392,711 | A | 7/1983 | Moraw et al. |
| 4,403,248 | A | 9/1983 | te Velde |
| 4,407,695 | A * | 10/1983 | Deckman et al. .............. 216/42 |

(Continued)

FOREIGN PATENT DOCUMENTS

CH                680534             9/1992

(Continued)

OTHER PUBLICATIONS

Akasaka, "Three-Dimensional IC Trends," Proceedings of IEEE, vol. 74, No. 12, pp. 1703-1714, (Dec. 1986).

(Continued)

*Primary Examiner*—Uyen-Chau N Le
*Assistant Examiner*—Chris H Chu
(74) *Attorney, Agent, or Firm*—Knobbe, Martens, Olson & Bear LLP

(57) ABSTRACT

A microelectromechanical device (MEMS) utilizing nanoparticles for reducing stiction is disclosed. In one embodiment, a microelectromechanical device is an interferometric modulator that includes a transparent electrode assembly having a first surface; and a movable reflective electrode assembly with a second surface facing the first surface. The movable reflective electrode assembly is movable between a relaxed and actuated (collapsed) position. Particles are deposited over the transparent electrode assembly or over a sacrificial layer separating the two electrodes. The particles lead to dimples in the reflective surface of the moving electrode. The particles can be removed with the sacrificial layer or remain in final devices.

17 Claims, 19 Drawing Sheets

U.S. PATENT DOCUMENTS

| | | |
|---|---|---|
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,663,181 A | 5/1987 | Murali |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,512 A | 5/1994 | Allman et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,374,346 A | 12/1994 | Bladon et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,452,138 A | 9/1995 | Mignardi et al. |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,578,976 A | 11/1996 | Yao |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |

| | | | |
|---|---|---|---|
| 5,619,059 A | 4/1997 | Li et al. |
| 5,619,365 A | 4/1997 | Rhoads et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A | 7/1997 | Kaeiyama |
| 5,647,819 A | 7/1997 | Fujita et al. |
| 5,650,834 A | 7/1997 | Nakagawa et al. |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,673,139 A | 9/1997 | Johnson |
| 5,674,757 A | 10/1997 | Kim |
| 5,683,591 A | 11/1997 | Offenberg |
| 5,703,710 A | 12/1997 | Brinkman et al. |
| 5,706,022 A | 1/1998 | Hato |
| 5,710,656 A | 1/1998 | Goossen |
| 5,726,480 A | 3/1998 | Pister |
| 5,739,945 A | 4/1998 | Tayebati |
| 5,745,193 A | 4/1998 | Urbanus et al. |
| 5,745,281 A | 4/1998 | Yi et al. |
| 5,766,727 A * | 6/1998 | Moroishi et al. ............ 428/141 |
| 5,771,116 A | 6/1998 | Miller et al. |
| 5,771,321 A | 6/1998 | Stern |
| 5,784,189 A | 7/1998 | Bozler et al. |
| 5,784,190 A | 7/1998 | Worley |
| 5,784,212 A | 7/1998 | Hornbeck |
| 5,793,504 A | 8/1998 | Stoll |
| 5,808,780 A | 9/1998 | McDonald |
| 5,818,095 A | 10/1998 | Sampsell |
| 5,822,110 A | 10/1998 | Dabbaj |
| 5,822,170 A | 10/1998 | Cabuz et al. |
| 5,824,608 A | 10/1998 | Gotoh et al. |
| 5,825,528 A | 10/1998 | Goossen |
| 5,835,255 A | 11/1998 | Miles |
| 5,838,484 A | 11/1998 | Goossen |
| 5,842,088 A | 11/1998 | Thompson |
| 5,867,302 A | 2/1999 | Fleming et al. |
| 5,896,796 A | 4/1999 | Chih |
| 5,912,758 A | 6/1999 | Knipe et al. |
| 5,914,803 A | 6/1999 | Hwang et al. |
| 5,920,421 A | 7/1999 | Choi |
| 5,943,155 A | 8/1999 | Goossen |
| 5,943,158 A | 8/1999 | Ford et al. |
| 5,959,763 A | 9/1999 | Bozler et al. |
| 5,972,193 A | 10/1999 | Chou et al. |
| 5,976,902 A | 11/1999 | Shih |
| 5,978,127 A | 11/1999 | Berg |
| 5,986,796 A | 11/1999 | Miles |
| 6,016,693 A | 1/2000 | Viani et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles |
| 6,057,903 A | 5/2000 | Colgan et al. |
| 6,061,075 A | 5/2000 | Nelson et al. |
| 6,097,145 A | 8/2000 | Kastalsky et al. |
| 6,099,132 A | 8/2000 | Kaeiyama |
| 6,100,477 A * | 8/2000 | Randall et al. ............. 200/181 |
| 6,100,872 A | 8/2000 | Aratani et al. |
| 6,113,239 A | 9/2000 | Sampsell et al. |
| 6,115,326 A | 9/2000 | Puma et al. |
| 6,147,790 A | 11/2000 | Meier et al. |
| 6,158,156 A | 12/2000 | Patrick |
| 6,160,833 A | 12/2000 | Floyd et al. |
| 6,166,422 A | 12/2000 | Qian et al. |
| 6,170,332 B1 | 1/2001 | MacDonald et al. |
| 6,180,428 B1 | 1/2001 | Peeters et al. |
| 6,194,323 B1 | 2/2001 | Downey et al. |
| 6,195,196 B1 | 2/2001 | Kimura et al. |
| 6,201,633 B1 | 3/2001 | Peeters et al. |
| 6,204,080 B1 | 3/2001 | Hwang |
| 6,219,015 B1 | 4/2001 | Bloom et al. |
| 6,229,683 B1 * | 5/2001 | Goodwin-Johansson .... 361/233 |
| 6,232,936 B1 | 5/2001 | Gove et al. |
| 6,243,149 B1 | 6/2001 | Swanson et al. |
| 6,246,398 B1 | 6/2001 | Koo |
| 6,249,039 B1 | 6/2001 | Harvey et al. |
| 6,282,010 B1 | 8/2001 | Sulzbach et al. |
| 6,284,560 B1 | 9/2001 | Jech et al. |
| 6,288,824 B1 | 9/2001 | Kastalsky et al. |
| 6,295,154 B1 | 9/2001 | Laor et al. |
| 6,323,982 B1 | 11/2001 | Hornbeck |
| 6,324,192 B1 | 11/2001 | Tayebati |
| 6,327,071 B1 | 12/2001 | Kimura et al. |
| 6,329,297 B1 | 12/2001 | Balish et al. |
| 6,335,831 B2 | 1/2002 | Kowarz et al. |
| 6,351,329 B1 | 2/2002 | Greywall |
| 6,356,254 B1 | 3/2002 | Kimura |
| 6,376,787 B1 | 4/2002 | Martin et al. |
| 6,391,675 B1 | 5/2002 | Ehmke et al. |
| 6,392,233 B1 | 5/2002 | Channin et al. |
| 6,392,781 B1 | 5/2002 | Kim et al. |
| 6,407,851 B1 | 6/2002 | Islam et al. |
| 6,447,126 B1 | 9/2002 | Hornbeck |
| 6,449,084 B1 | 9/2002 | Guo |
| 6,452,465 B1 | 9/2002 | Brown et al. |
| 6,456,420 B1 | 9/2002 | Goodwin-Johansson |
| 6,465,355 B1 | 10/2002 | Horsley |
| 6,466,354 B1 | 10/2002 | Gudeman |
| 6,466,358 B2 | 10/2002 | Tew |
| 6,473,072 B1 | 10/2002 | Comiskey et al. |
| 6,473,274 B1 | 10/2002 | Maimone et al. |
| 6,480,177 B2 | 11/2002 | Doherty et al. |
| 6,496,122 B2 | 12/2002 | Sampsell |
| 6,513,911 B1 | 2/2003 | Ozaki et al. |
| 6,522,801 B1 | 2/2003 | Aksyuk et al. |
| 6,531,945 B1 | 3/2003 | Ahn et al. |
| 6,537,427 B1 | 3/2003 | Raina et al. |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,577,785 B1 | 6/2003 | Spahn et al. |
| 6,589,625 B1 | 7/2003 | Kothari et al. |
| 6,597,490 B2 | 7/2003 | Tayebati |
| 6,600,201 B2 | 7/2003 | Hartwell et al. |
| 6,602,791 B2 | 8/2003 | Ouellet et al. |
| 6,606,175 B1 | 8/2003 | Sampsell et al. |
| 6,608,268 B1 | 8/2003 | Goldsmith |
| 6,610,440 B1 | 8/2003 | LaFollette et al. |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,642,913 B1 | 11/2003 | Kimura et al. |
| 6,643,069 B2 | 11/2003 | Dewald |
| 6,650,455 B2 | 11/2003 | Miles |
| 6,653,997 B2 | 11/2003 | Van Gorkom et al. |
| 6,657,832 B2 | 12/2003 | Williams et al. |
| 6,666,561 B1 | 12/2003 | Blakley |
| 6,674,562 B1 | 1/2004 | Miles et al. |
| 6,674,563 B2 | 1/2004 | Chui et al. |
| 6,680,792 B2 | 1/2004 | Miles |
| 6,710,908 B2 | 3/2004 | Miles et al. |

| Patent Number | Date | Inventor | | Publication Number | Date | Inventor |
|---|---|---|---|---|---|---|
| 6,720,267 B1 | 4/2004 | Chen et al. | | 2002/0024711 A1 | 2/2002 | Miles |
| 6,736,987 B1 | 5/2004 | Cho | | 2002/0031155 A1 | 3/2002 | Tayebati et al. |
| 6,741,377 B2 | 5/2004 | Miles | | 2002/0036304 A1 | 3/2002 | Ehmke et al. |
| 6,741,384 B1 | 5/2004 | Martin et al. | | 2002/0054422 A1 | 5/2002 | Carr et al. |
| 6,741,503 B1 | 5/2004 | Farris et al. | | 2002/0054424 A1 | 5/2002 | Miles |
| 6,743,570 B2 | 6/2004 | Harnett et al. | | 2002/0055253 A1 | 5/2002 | Rudhard |
| 6,747,785 B2 | 6/2004 | Chen et al. | | 2002/0071169 A1 | 6/2002 | Bowers et al. |
| 6,747,800 B1 | 6/2004 | Lin | | 2002/0075555 A1 | 6/2002 | Miles |
| 6,756,317 B2 | 6/2004 | Sniegowski et al. | | 2002/0086455 A1 | 7/2002 | Franosch et al. |
| 6,760,146 B2 | 7/2004 | Ikeda et al. | | 2002/0109899 A1 | 8/2002 | Ohtaka et al. |
| 6,768,097 B1 | 7/2004 | Viktorovitch et al. | | 2002/0110948 A1 | 8/2002 | Huang et al. |
| 6,775,174 B2 | 8/2004 | Huffman et al. | | 2002/0126364 A1 | 9/2002 | Miles |
| 6,778,155 B2 | 8/2004 | Doherty et al. | | 2002/0131682 A1 | 9/2002 | Nasiri et al. |
| 6,778,306 B2 | 8/2004 | Sniegowski et al. | | 2002/0135857 A1 | 9/2002 | Fitzpatrick et al. |
| 6,780,491 B1 * | 8/2004 | Cathey et al. ............... 428/143 | | 2002/0137072 A1 | 9/2002 | Mirkin et al. |
| 6,794,119 B2 | 9/2004 | Miles | | 2002/0146200 A1 | 10/2002 | Kudric et al. |
| 6,803,534 B1 * | 10/2004 | Chen et al. .................. 200/181 | | 2002/0149828 A1 | 10/2002 | Miles |
| 6,806,557 B2 | 10/2004 | Ding | | 2002/0149850 A1 | 10/2002 | Heffner et al. |
| 6,811,267 B1 | 11/2004 | Allen et al. | | 2002/0168136 A1 | 11/2002 | Atia et al. |
| 6,812,482 B2 | 11/2004 | Fleming et al. | | 2002/0195681 A1 | 12/2002 | Melendez et al. |
| 6,819,469 B1 | 11/2004 | Koba | | 2003/0006468 A1 | 1/2003 | Ma et al. |
| 6,822,304 B1 | 11/2004 | Honer | | 2003/0015936 A1 | 1/2003 | Yoon et al. |
| 6,822,628 B2 | 11/2004 | Dunphy et al. | | 2003/0036215 A1 | 2/2003 | Reid |
| 6,829,132 B2 | 12/2004 | Martin et al. | | 2003/0043157 A1 | 3/2003 | Miles |
| 6,853,129 B1 | 2/2005 | Cummings et al. | | 2003/0053078 A1 | 3/2003 | Missey et al. |
| 6,855,610 B2 | 2/2005 | Tung et al. | | 2003/0054588 A1 | 3/2003 | Patel et al. |
| 6,859,218 B1 | 2/2005 | Luman et al. | | 2003/0062186 A1 | 4/2003 | Boroson et al. |
| 6,859,301 B1 | 2/2005 | Islam et al. | | 2003/0072070 A1 | 4/2003 | Miles |
| 6,861,277 B1 | 3/2005 | Monroe et al. | | 2003/0090350 A1 | 5/2003 | Feng et al. |
| 6,862,022 B2 | 3/2005 | Slupe | | 2003/0091072 A1 | 5/2003 | Wang et al. |
| 6,862,029 B1 | 3/2005 | D'Souza et al. | | 2003/0112096 A1 | 6/2003 | Potter |
| 6,867,896 B2 | 3/2005 | Miles | | 2003/0119221 A1 | 6/2003 | Cunningham et al. |
| 6,870,581 B2 | 3/2005 | Li et al. | | 2003/0123126 A1 | 7/2003 | Meyer et al. |
| 6,870,654 B2 | 3/2005 | Lin et al. | | 2003/0138213 A1 | 7/2003 | Jin et al. |
| 6,881,535 B2 | 4/2005 | Yamaguchi | | 2003/0152872 A1 | 8/2003 | Miles |
| 6,882,458 B2 | 4/2005 | Lin et al. | | 2003/0164350 A1 | 9/2003 | Hanson et al. |
| 6,882,461 B1 | 4/2005 | Tsai et al. | | 2003/0201784 A1 | 10/2003 | Potter |
| 6,906,849 B1 | 6/2005 | Mi et al. | | 2003/0202264 A1 | 10/2003 | Weber et al. |
| 6,912,022 B2 | 6/2005 | Lin et al. | | 2003/0202265 A1 | 10/2003 | Reboa et al. |
| 6,940,631 B2 | 9/2005 | Ishikawa | | 2003/0202266 A1 | 10/2003 | Ring et al. |
| 6,952,303 B2 | 10/2005 | Lin et al. | | 2003/0231373 A1 | 12/2003 | Kowarz et al. |
| 6,952,304 B2 | 10/2005 | Mushika et al. | | 2004/0008396 A1 | 1/2004 | Stappaerts |
| 6,958,847 B2 | 10/2005 | Lin | | 2004/0010115 A1 | 1/2004 | Sotzing |
| 6,980,350 B2 | 12/2005 | Hung et al. | | 2004/0027636 A1 | 2/2004 | Miles |
| 6,982,820 B2 | 1/2006 | Tsai | | 2004/0027701 A1 | 2/2004 | Ishikawa |
| 6,987,432 B2 | 1/2006 | Lutz et al. | | 2004/0028849 A1 | 2/2004 | Stark et al. |
| 6,995,890 B2 | 2/2006 | Lin | | 2004/0035821 A1 | 2/2004 | Doan et al. |
| 7,006,272 B2 | 2/2006 | Tsai | | 2004/0051929 A1 | 3/2004 | Sampsell et al. |
| 7,016,095 B2 | 3/2006 | Lin | | 2004/0053434 A1 | 3/2004 | Bruner |
| 7,016,099 B2 | 3/2006 | Ikeda et al. | | 2004/0056742 A1 | 3/2004 | Dabbaj |
| 7,027,202 B1 | 4/2006 | Hunter et al. | | 2004/0058531 A1 | 3/2004 | Hsieh et al. |
| 7,041,571 B2 | 5/2006 | Strane | | 2004/0058532 A1 | 3/2004 | Miles et al. |
| 7,042,643 B2 | 5/2006 | Miles et al. | | 2004/0061543 A1 | 4/2004 | Nam et al. |
| 7,110,158 B2 | 9/2006 | Miles | | 2004/0063322 A1 | 4/2004 | Yang |
| 7,119,945 B2 | 10/2006 | Kothari et al. | | 2004/0070813 A1 | 4/2004 | Aubuchon |
| 7,123,216 B1 | 10/2006 | Miles | | 2004/0080035 A1 | 4/2004 | Delapierre |
| 7,161,730 B2 | 1/2007 | Floyd | | 2004/0080807 A1 | 4/2004 | Chen et al. |
| 7,193,768 B2 | 3/2007 | Lin | | 2004/0087086 A1 | 5/2004 | Lee |
| 7,233,029 B2 | 6/2007 | Mochizuki | | 2004/0100677 A1 | 5/2004 | Huibers et al. |
| 7,289,259 B2 | 10/2007 | Chui et al. | | 2004/0100680 A1 | 5/2004 | Huibers et al. |
| 7,329,917 B2 | 2/2008 | Patraw et al. | | 2004/0124073 A1 | 7/2004 | Pillans et al. |
| 7,373,026 B2 | 5/2008 | Chui | | 2004/0125281 A1 | 7/2004 | Lin et al. |
| 7,417,783 B2 | 8/2008 | Chui et al. | | 2004/0125282 A1 | 7/2004 | Lin et al. |
| 7,499,618 B2 * | 3/2009 | Mataki et al. ............... 385/129 | | 2004/0125536 A1 | 7/2004 | Arney et al. |
| 2001/0003487 A1 | 6/2001 | Miles | | 2004/0136045 A1 | 7/2004 | Tran |
| 2001/0010953 A1 | 8/2001 | Kang et al. | | 2004/0136076 A1 | 7/2004 | Tayebati |
| 2001/0026951 A1 | 10/2001 | Vergani et al. | | 2004/0145049 A1 | 7/2004 | McKinnell et al. |
| 2001/0028503 A1 | 10/2001 | Flanders et al. | | 2004/0145811 A1 | 7/2004 | Lin et al. |
| 2001/0040649 A1 | 11/2001 | Ozaki | | 2004/0147056 A1 | 7/2004 | McKinnell et al. |
| 2001/0040675 A1 | 11/2001 | True et al. | | 2004/0147198 A1 | 7/2004 | Lin et al. |
| 2001/0055208 A1 | 12/2001 | Kimura | | 2004/0148009 A1 | 7/2004 | Buzzard |
| 2002/0015215 A1 | 2/2002 | Miles | | 2004/0150869 A1 | 8/2004 | Kasai |
| 2002/0021485 A1 | 2/2002 | Pilossof | | 2004/0160143 A1 | 8/2004 | Shreeve et al. |

| | | |
|---|---|---|
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0201908 A1 | 10/2004 | Kaneko |
| 2004/0207497 A1 | 10/2004 | Hsu et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Piehl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0012577 A1* | 1/2005 | Pillans et al. ............... 335/78 |
| 2005/0012975 A1 | 1/2005 | George et al. |
| 2005/0014317 A1* | 1/2005 | Pyo ............................ 438/184 |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0098840 A1 | 5/2005 | Fuertsch et al. |
| 2005/0128565 A1 | 6/2005 | Ljungblad |
| 2005/0168849 A1 | 8/2005 | Lin |
| 2005/0195462 A1 | 9/2005 | Lin |
| 2005/0195467 A1 | 9/2005 | Kothari et al. |
| 2005/0202649 A1 | 9/2005 | Hung et al. |
| 2005/0249966 A1 | 11/2005 | Tung et al. |
| 2005/0250235 A1* | 11/2005 | Miles et al. ................ 438/48 |
| 2006/0006138 A1 | 1/2006 | Lin |
| 2006/0018348 A1 | 1/2006 | Przybyla et al. |
| 2006/0024620 A1 | 2/2006 | Nikkel et al. |
| 2006/0024880 A1* | 2/2006 | Chui et al. ................ 438/222 |
| 2006/0066511 A1 | 3/2006 | Chui |
| 2006/0066932 A1 | 3/2006 | Chui et al. |
| 2006/0066935 A1 | 3/2006 | Cummings et al. |
| 2006/0077518 A1 | 4/2006 | Chui et al. |
| 2006/0119922 A1 | 6/2006 | Faase et al. |
| 2006/0203325 A1 | 9/2006 | Faase et al. |
| 2007/0019280 A1 | 1/2007 | Sasagawa et al. |
| 2007/0041703 A1 | 2/2007 | Wang |
| 2007/0042521 A1 | 2/2007 | Yama |
| 2007/0096300 A1 | 5/2007 | Wang et al. |
| 2007/0170540 A1 | 7/2007 | Chung et al. |
| 2008/0026328 A1 | 1/2008 | Miles |
| 2008/0100899 A1 | 5/2008 | Shimokawa et al. |
| 2008/0226929 A1 | 9/2008 | Chung et al. |
| 2008/0283180 A1 | 11/2008 | Bachman et al. |
| 2008/0314866 A1 | 12/2008 | Chui et al. |

FOREIGN PATENT DOCUMENTS

| | | |
|---|---|---|
| CH | 681 047 | 12/1992 |
| CN | 092109265 | 11/2003 |
| DE | 10228946 A1 | 1/2004 |
| DE | 103 25 334 A1 | 1/2005 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0878824 A2 | 11/1998 |
| EP | 1 088 785 A1 | 4/2001 |
| EP | 1 170 618 | 1/2002 |
| EP | 1197778 | 4/2002 |
| EP | 1258860 A1 | 11/2002 |
| EP | 1 452 481 | 9/2004 |
| EP | 1 484 635 | 12/2004 |
| EP | 1 640 772 A | 3/2006 |
| FR | 2824643 | 10/1999 |
| JP | 405275401 | 10/1993 |
| JP | 06301054 | 10/1994 |
| JP | 08293580 | 11/1996 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2002 062493 | 2/2002 |
| JP | 2002-270575 | 9/2002 |
| JP | 2002-277771 | 9/2002 |
| JP | 2002-341267 | 11/2002 |
| JP | 2002-355800 | 12/2002 |
| JP | 2003-021798 | 1/2003 |
| JP | 2003001598 A | 1/2003 |
| JP | 2003-215475 | 7/2003 |
| JP | 2004-102022 A | 4/2004 |
| JP | 2004106074 A | 4/2004 |
| JP | 2004157527 | 6/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | RCO 157313 | 5/1991 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO 02/38491 A1 | 5/2002 |
| WO | WO 02/079853 | 10/2002 |
| WO | WO03007049 A1 | 1/2003 |
| WO | WO 03/052506 | 6/2003 |
| WO | WO 03/069404 | 8/2003 |
| WO | WO 03/069413 A | 8/2003 |
| WO | WO03069413 A1 | 8/2003 |
| WO | WO03073151 A1 | 9/2003 |
| WO | WO 04/000717 | 12/2003 |
| WO | WO2004006003 A1 | 1/2004 |
| WO | WO2004026757 A2 | 4/2004 |
| WO | WO 2005/006364 | 1/2005 |
| WO | WO 2005/019899 A1 | 3/2005 |
| WO | WO 2005/085932 A | 9/2005 |
| WO | WO 2006/036385 | 4/2006 |
| WO | WO 2006/036437 | 4/2006 |
| WO | WO 2006/036542 | 4/2006 |

| WO | WO 2006/073111 | 7/2006 |

OTHER PUBLICATIONS

Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573. (date unknown).
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microclectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. (1996).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing for General-Purpose," IEEE, 0-8186-8900-, pp. 68-77, (May 1998).

Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (0125/2006).
PCT/US05/031693 International Search Report.
PCT/US05/032331 International Search Report (Apr. 7, 2006).
PCT/US05/033558 Partial International Search Report (Feb. 24, 2006).
PCT/US2004/035820 International Search Report and Written Opinion (Nov. 4, 2005).
PCT/US96/17731 Search Report.
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 international Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34. No. 1, pp. 70-73 (Jan. 1979).
Winton, "A novel way to capture solar energy," Chemical Week, (May 1985).
Wu, "Design of a Reflective Color LCD Using Optical Interference Reflectors," ASIA Display '95, pp. 929-931, (Oct. 1995).
Zhou et al., "Waveguide Panel Display Using Electromechanical Spatial Modulators" SID Digest, vol. XXIX, (1998).
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise for Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-8327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microenglneering vol. 6 No. 2, 197-211 XP 002360789 Jun. 1996 IOP Publishing.
Furneaux, et al. "The Formation of Controlled-porosity membranes from Anodically Oxidized Aluminium" Nature vo 337 Jan. 12, 1989, pp. 147-149.
Jerman J. H. et al., "Maniature Fabry-Perot Interferometers Micromachined in Silicon for Use in Optical Fiber WDM Systems,"

Transducers. San Francisco, Jun. 24-27, 1991, Proceedings of the Internatioal Conference on Solid State Sensors Andactuators, New Youk IEEE, US, vol. Conf. 6, Jun. 24, 1991.

Lieberman, "MEMS Display Looks to Give PDAs Sharper Image," EE Times (Feb. 11, 1997).

Lieberman, "Microbridges at Heart of New MEMS Displays," EE Times (Apr. 24, 1997).

Maboudian, et al. Critical Review: Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Penta Vacuum MEMS Etcher Specifications, http:www.pentavacuum.com/memes.htm.

Science and Technology, The Economist, pp. 89-90, (May 1999).

Search Report PCT/US05/030033 and Written Opinion.

Search Report PCT/US05/030902.

Search Report and Written Opinion for PCT/US05/33558 (May 19, 2005).

Search Report PCT/US05/032331 (Apr. 7, 2006).

Search Report PCT/US05/032331 (Jan. 9, 2006).

Search Report and written opinion PCT/US05/032647.

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Thin Film Transistors—Materials and Processes—vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Product information.

International Search Report dated Oct. 1, 2007 for International Application No. PCT/US2007/009267 based on the present application.

ISR and WO for PCT/US07/009267 filed Apr. 12, 2007.

Kogut et al., "A finite element based elastic-plastic model for the contact of rough surfaces", *Tribology Transactions*, Dept. of Mechanical Engineering, Haifa, 32000, Israel, vol. 46 (2003), 3, pp. 383-390.

Matsumoto et al., "Novel prevention method of stiction using silicon anodization for SOI structure", *Sensors and Actuators*, vol. A72 (1999), pp. 153-159.

Chiou et al., "A Novel Capacitance Control Design of Tunable Capacitor Using Multiple Electrostatic Driving Electrodes," IEEE Nano 2001, M 3.1, Nanoelectronics and Giga-Scale Systems (Special Session), Oct. 29, 2001, pp. 319-324.

Fork, et al., "P-67: Chip on Glass Bonding using StressedMetal™ Technology" Sid 05 Digest, May 24, 2005.

U.S. Office Action issued Feb. 3, 2009 in U.S. Appl. No. 11/406,866.

Niklasson, "Modeling the Optical Properties of Nanoparticles," SPIE Newsroom, Apr. 20, 2006, pp. 1-4.

Rahman et al., "Size-Dependent Physicochemical and Optical Properties of Silica Nanoparticles," Mater. Chem. and Phys., Mar. 15, 2009, vol. 114, 1, pp. 1-2.

World Wide Web, e ce.gatech.edu/research/labs/vc/theory/photolith.html, "Photolithography," Jul. 2009, pp. 1-4.

World Wide Web, en.wikipedia.org/wiki/Nanoparticle, "Nanoparticle," Jun. 2009, pp. 1-10.

* cited by examiner

MICROELECTROMECHANICAL DEVICE AND METHOD UTILIZING NANOPARTICLES

CROSS-REFERENCE TO RELATED APPLICATIONS

This application is related to U.S. application Ser. No. 11/189,690, filed Jul. 26, 2005 entitled SYSTEM AND METHOD FOR MICRO-ELECTROMECHANICAL OPERATION OF AN INTERFEROMETRIC MODULATOR; U.S. application Ser. No. 11/406,776, filed Apr. 19, 2006 entitled NON-PLANAR SURFACE STRUCTURES AND PROCESS FOR MICROELECTROMECHANICAL SYSTEMS (Inventors: Ming Hau Tung, Sriram Akella, William J. Cummings and Lior Kogut); U.S. application Ser. No. 11/406,981, filed Apr. 19, 2006 entitled NON-PLANAR SURFACE STRUCTURES AND PROCESS FOR MICRO-ELECTROMECHANICAL SYSTEMS (Inventors: Qi Luo, Sriram Akella, and Lior Kogut); U.S. application Ser. No. 11/406,866, filed Apr. 19, 2006 entitled NON-PLANAR SURFACE STRUCTURES AND PROCESS FOR MICRO-ELECTROMECHANICAL SYSTEMS (Inventors: Teruo Sasagawa, Lior Kogut, and Ming-Hau Tung); and U.S. application Ser. No. 11/407,470, filed Apr. 19, 2006 entitled MICROELECTROMECHANICAL DEVICE AND METHOD UTILIZING A POROUS SURFACE (Inventors: Teruo Sasagawa and Lior Kogut).

BACKGROUND OF THE INVENTION

1. Field of the Invention

This invention relates to microelectromechanical devices and methods for making the same. More particularly, this invention relates to engineering surfaces of moving and stationary electrode assemblies on either side of collapsing gap.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one aspect, an interferometric modulator is provided. The interferometric modulator includes a transparent or partially transparent electrode assembly having a first surface and a reflective electrode assembly having a second surface facing the first surface. The reflective electrode assembly is located substantially parallel to the transparent electrode assembly. The reflective electrode assembly is movable between a first position and a second position. The first position is a first distance from the transparent electrode assembly, and the second position is a second distance from the transparent electrode assembly. The second distance is greater than the first distance. The second surface has a plurality of dimples, each of the dimples having a diameter between about 10 Å and about 500 Å.

In the interferometric modulator, the plurality of dimples may cover between about 5% and about 75% of the second surface. The interferometric modulator may further comprise a plurality of particles, each of the particles being positioned in one of the dimples. The reflective electrode assembly may comprise a first material and the plurality of particles may comprise a second material. In addition, the second material may be harder and more resistant to creep than the first material.

The first material may be a reflector selected from, e.g., Al, Au, Ag, and their alloys. The first material may be a conductor selected from, e.g., Cu, Pt, Ni, Au, Al, and alloys of the foregoing. In one embodiment, the first material may comprise Al and the second material may comprise $Al_2O_3$. The second material may be selected from, e.g., cadmium, indium, magnesium, cerium, tin, zinc, cesium oxide, calcium carbonate, gallium, bismuth oxide, barium fluoride, zirconium oxide, zinc oxide, barium sulfate, barium titanate, calcium chloride, and calcium oxide. The materials noted above are exemplary only, and it will be appreciated that other materials can serve the intended functions. The transparent electrode assembly may comprise a plurality of particles on the first surface. Each of the plurality of particles may have a diameter between about 10 Å and about 500 Å. The plurality of particles may not be all aligned with corresponding ones of the dimples when the reflective electrode assembly is in the first position. The transparent electrode assembly may comprise a dielectric layer defining the first surface.

The reflective electrode assembly may comprise a reflective electrode and a deformable layer. The reflective electrode may be attached to the deformable layer. Alternatively, the reflective electrode may be suspended from the deformable layer. The interferometric modulator may further comprise a sacrificial layer between the transparent electrode assembly and the reflective electrode assembly. The interferometric modulator may further comprise particles on the sacrificial layer.

In another aspect, a display system is provided. The display device includes: the interferometric modulator described above; a display; a processor that is in electrical communication with the display, the processor being configured to process image data; and a memory device in electrical communication with the processor. The display system may further comprise a first controller configured to send at least one signal to the display, and a second controller configured to send at least a portion of the image data to the first controller. The display system may further comprise an image source module configured to send the image data to the processor. The image source module may comprise at least one of a receiver, transceiver, and transmitter. The display system may further comprise an input device configured to receive input data and to communicate the input data to the processor.

In yet another aspect, an electronic device is provided. The electronic device includes the display system described above.

In another aspect, an interferometric modulator includes: a transparent electrode assembly having a first surface, the transparent electrode assembly having a plurality of particles on the first surface, the particles having an average diameter between about 10 Å and about 500 Å; and a reflective electrode assembly having a second surface facing the first surface, the reflective electrode assembly being located substantially parallel to the transparent electrode assembly, the reflective electrode assembly movable between a first position and a second position, the first position being a first distance from the transparent electrode assembly, the second position being a second distance from the transparent electrode assembly, the second distance being greater than the first distance. In the interferometric modulator, the first distance may be substantially equal to the average diameter of the particles.

In another aspect, an interferometric modulator includes: transmissive means for at least partially transmitting incident light, the transmissive means having a first surface; reflective means for substantially reflecting incident light, the reflective means having a second surface facing the first surface; and means for moving the reflective means relative to the transmissive means between a driven position and an undriven position, the driven position being closer to the transmissive means than is the undriven position, wherein one of the first surface and the second surface has means for increasing roughness of the one of the first and second surfaces by about 5 Å RMS to about 100 Å RMS. The means for increasing roughness may also increase surface separation between the first and second surfaces by about 5 Å to about 100 Å. The means for increasing roughness may comprise dimples. The means for increasing roughness may comprise particles on the first surface. The transmissive means for at least partially transmitting incident light may comprise an indium tin oxide layer.

In yet another aspect, a microelectromechanical device is provided. The microelectromechanical device includes: a first electrode structure having a first surface; and a second electrode structure having a second surface facing the first surface, the second electrode structure being located substantially parallel to the first electrode structure, the second electrode structure movable between a first position and a second position, the first position being a first distance from the first electrode structure, the second position being a second distance from the first electrode structure, the second distance being greater than the first distance, wherein the second surface has a plurality of dimples, each of the dimples having a diameter between about 10 Å and about 500 Å.

In another aspect, a method of making a microelectromechanical system (MEMS) device is provided. The method includes: forming a first electrode; providing a dielectric layer over the first electrode; providing a sacrificial layer over the dielectric layer; forming a second electrode over the sacrificial layer; and depositing a plurality of particles between the dielectric layer and the second electrode after providing the dielectric layer and before forming the second electrode.

In the method, the plurality of particles may be deposited provided on the sacrificial layer. The plurality of particles may be deposited on the dielectric layer. The plurality of particles may have a diameter between about 10 Å and about 500 Å. The method may further comprise removing the sacrificial layer. Removing the sacrificial layer may further comprise removing the plurality of particles. The plurality of particles may not be removed during the step of removing the sacrificial layer. Depositing the plurality of particles may comprise using a spin-on process. In one embodiment, the second electrode may comprise aluminum and the plurality of particles may comprise $Al_2O_3$. The sacrificial layer may comprise molybdenum, silicon, or tungsten, and removing the sacrificial layer may comprise using a fluorine-based etchant, such as $XeF_2$. The plurality of particles may be etchable by the etchant. Examples of materials etchable by the fluorine-based etchant include, but are not limited to, molybdenum, silicon, tungsten, titanium, and tantalum. The plurality of particles may not be etchable by the etchant. Examples of materials not etchable by the fluorine-based etchant include, but are not limited to, aluminum oxide, cadmium, indium, magnesium, cerium, tin, zinc, cesium oxide, calcium carbonate, gallium, bismuth oxide, barium fluoride, zirconium oxide, zinc oxide, barium sulfate, barium titanate, calcium chloride, and calcium oxide.

In another aspect, a method of making an optical microelectromechanical system (MEMS) device includes: forming a first at least partially transparent electrode; providing a dielectric layer over the first electrode; providing a sacrificial layer over the dielectric layer; forming a second reflective electrode over the sacrificial layer; and depositing a plurality of particles over the dielectric layer after providing the dielectric layer and before forming the second electrode.

In the method, the plurality of particles may be deposited on the sacrificial layer. Alternatively, the plurality of particles may be deposited on the dielectric layer. The method may further comprise removing the sacrificial layer.

In another aspect, an interferometric modulator made by the method described above is provided.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Stiction can be one of the most important reliability issues in microelectromechanical systems in general and interferometric modulator in particular. "Stiction," as used herein, refers to a tendency of a movable layer in an actuated position to stick to a stationary layer in a microelectromechanical system. In embodiments of the invention, an interferometric modulator, which is an optical MEMS device, employs dimples and/or nanoparticles on contacting surfaces of movable and stationary layers.

Figure 1:
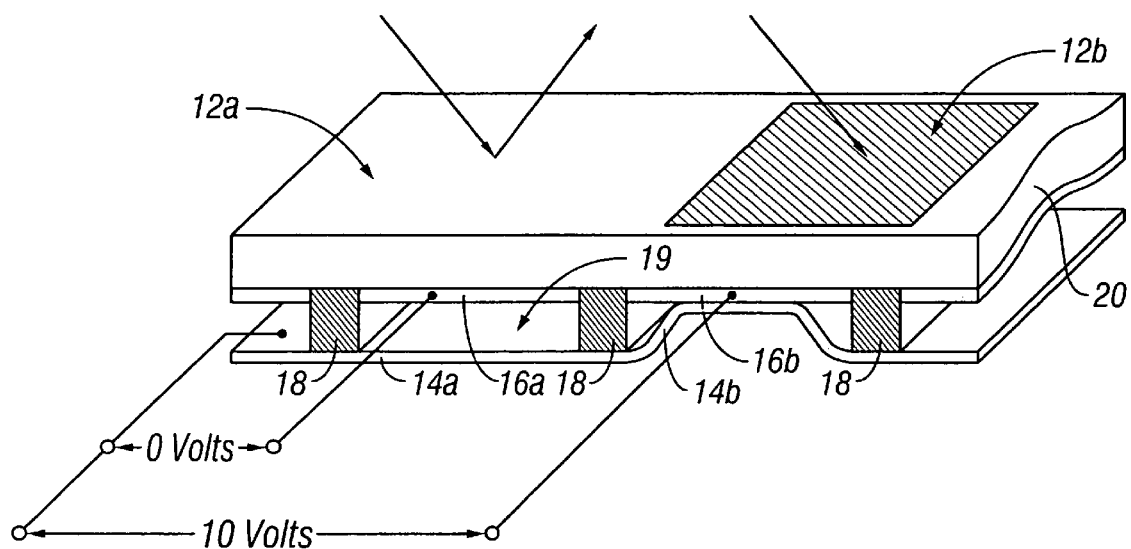
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metallic layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap or cavity 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
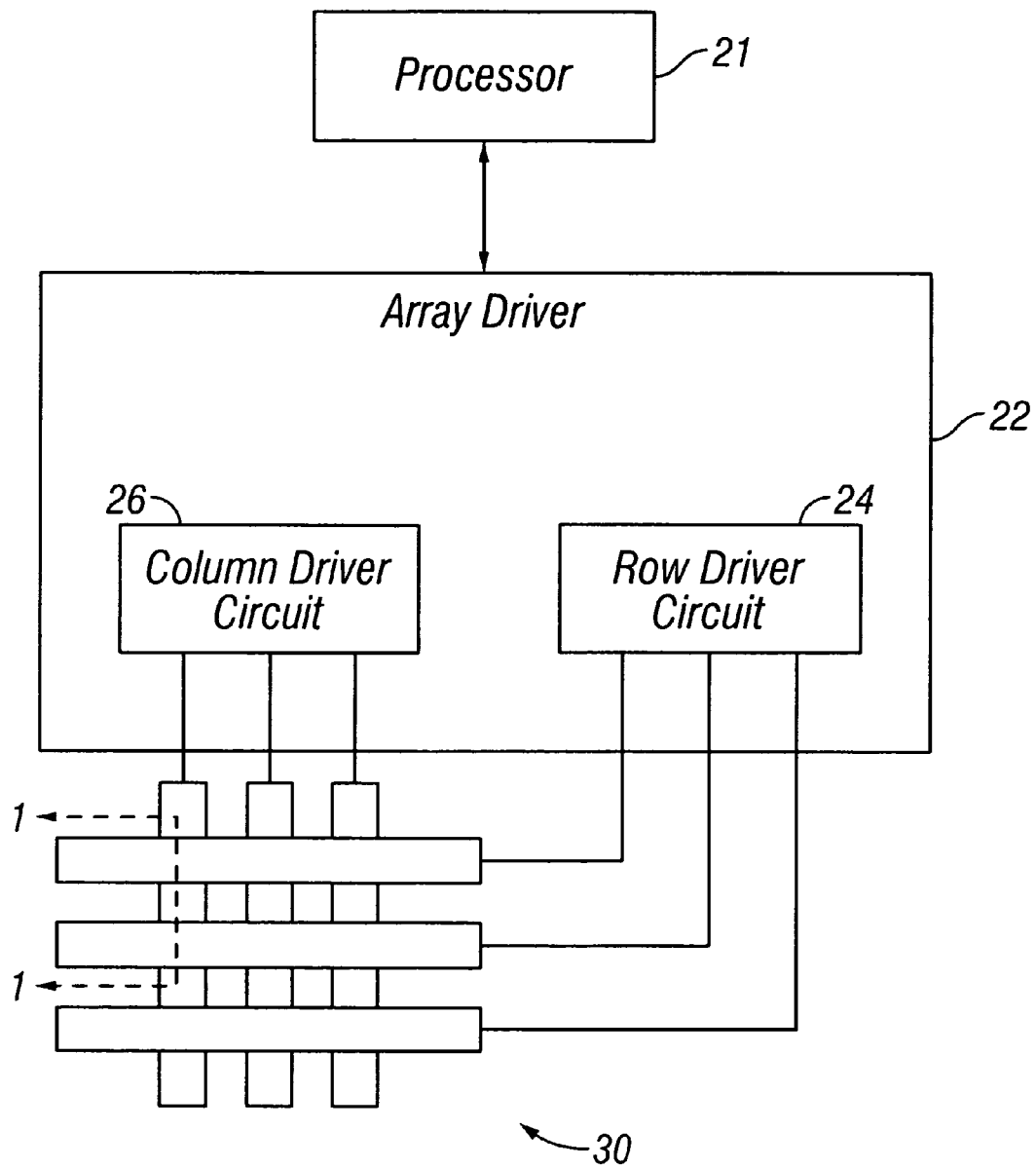
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
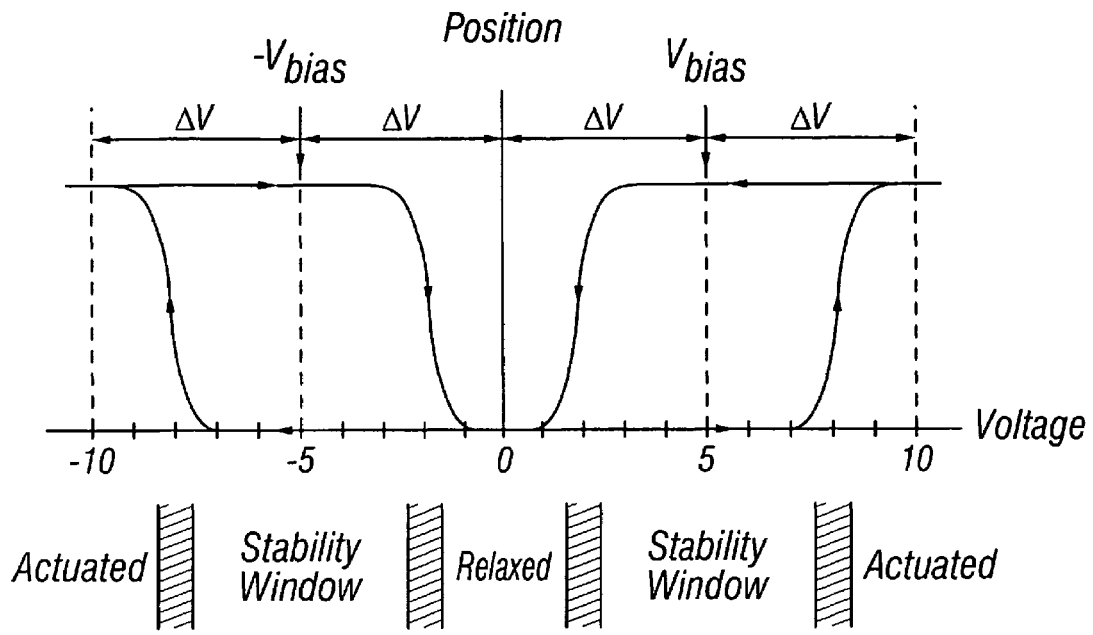
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
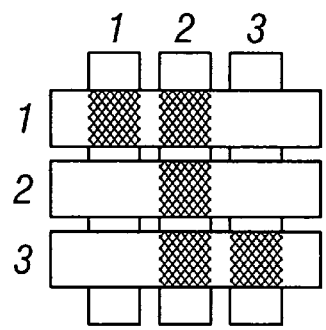
FIGS. 5A and 5B illustrate one exemplary timing diagram for row and column signals that may be used to write a frame of display data to the 3×3 interferometric modulator display of FIG. 2.
Figure 5B:
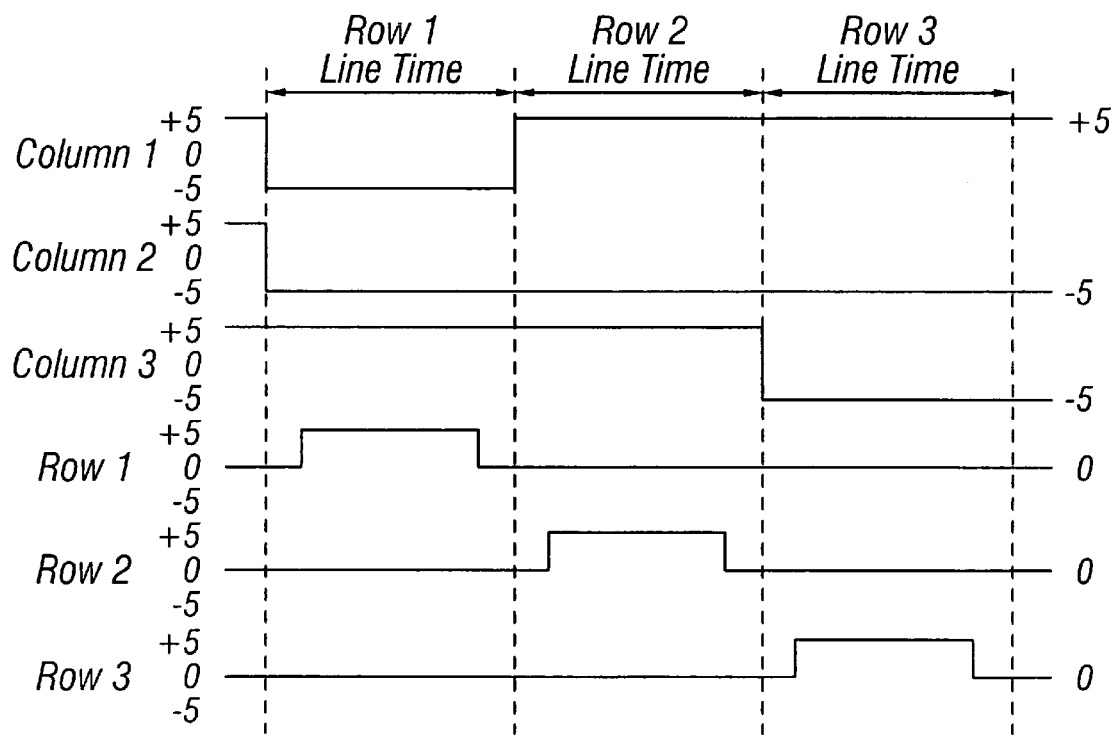

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
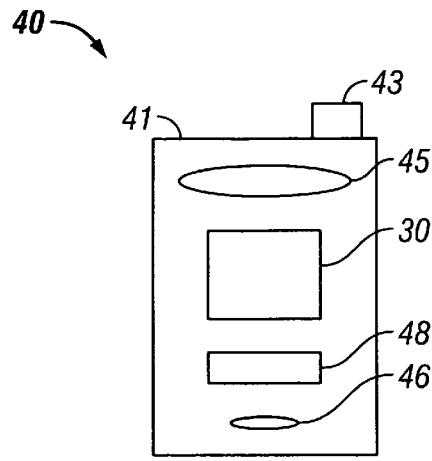
FIGS. 6A and 6B are system block diagrams illustrating an embodiment of a visual display device comprising a plurality of interferometric modulators.
Figure 6B:
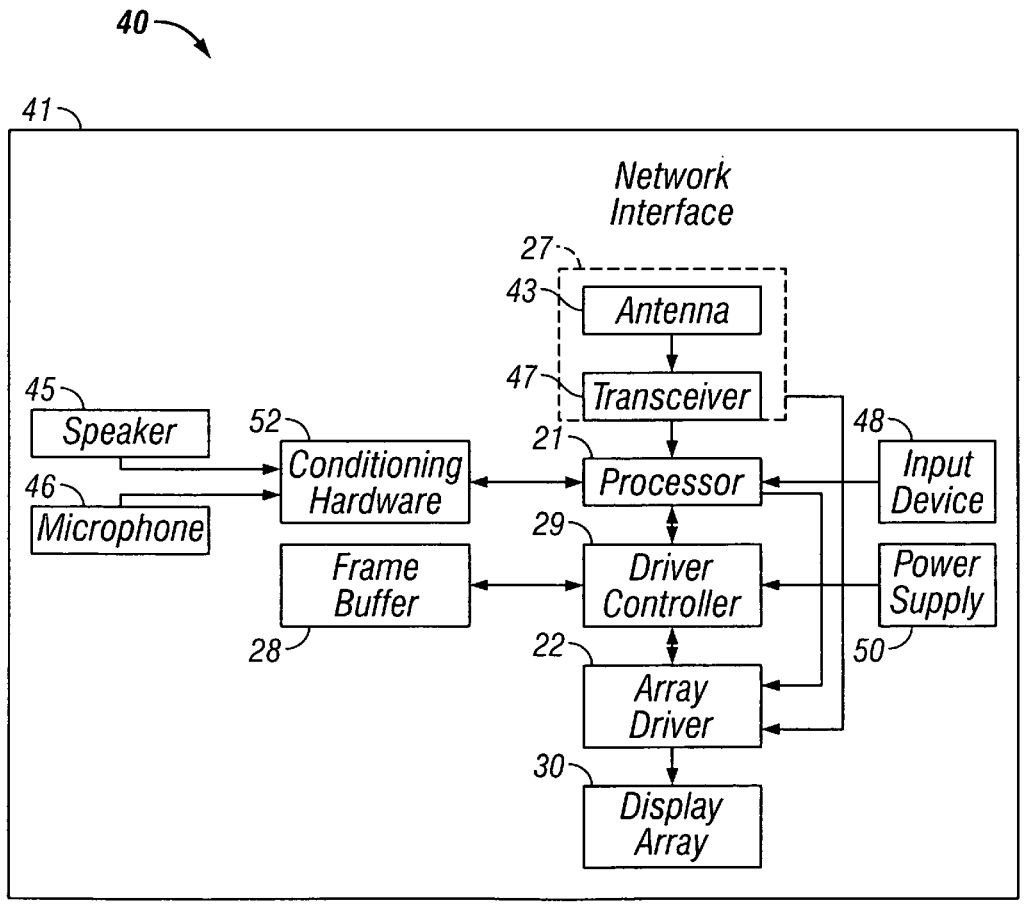

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
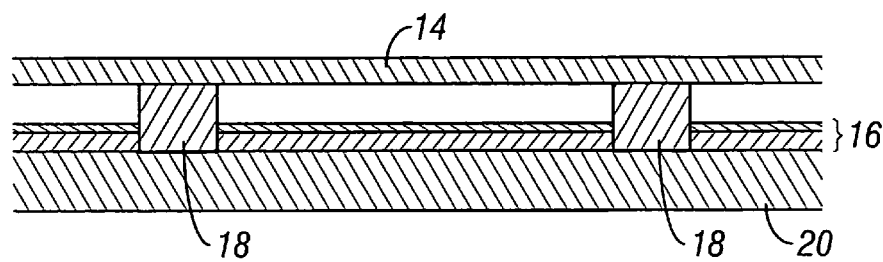
FIG. 7A is a cross section of the device of FIG. 1.
Figure 7B:
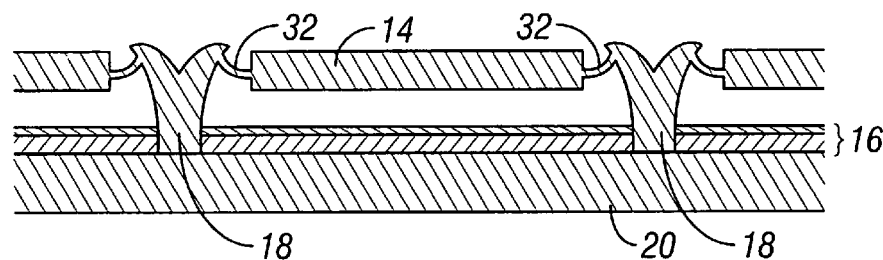
FIG. 7B is a cross section of an alternative embodiment of an interferometric modulator.
Figure 7C:
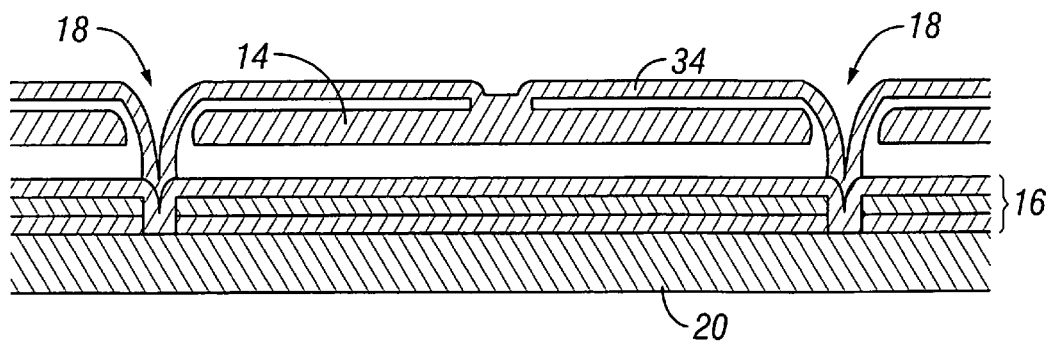
FIG. 7C is a cross section of another alternative embodiment of an interferometric modulator.
Figure 7D:
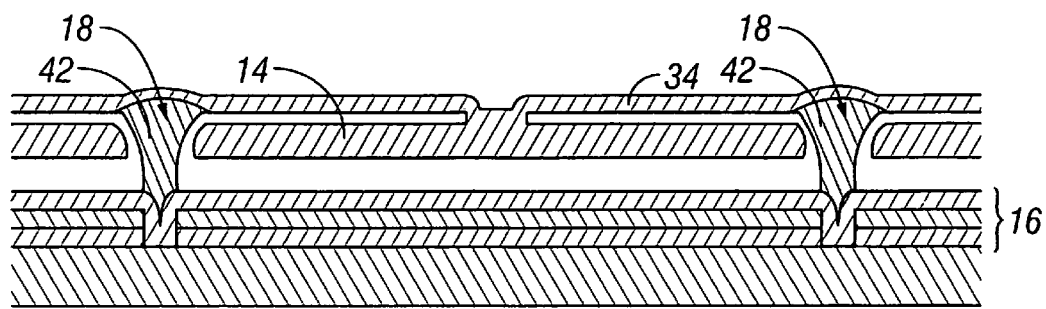
FIG. 7D is a cross section of yet another alternative embodiment of an interferometric modulator.
Figure 7E:
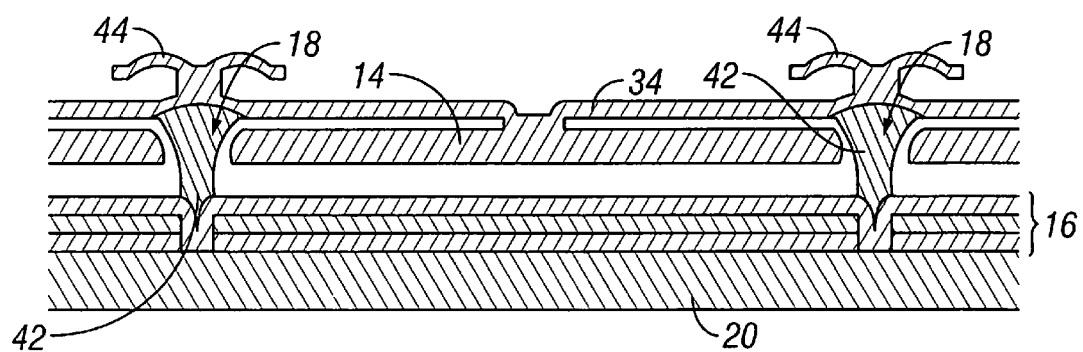
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 at various locations. The connections are herein referred to as support structures or posts 18. The embodiment illustrated in FIG. 7D has support structures 18 including support post plugs 42 upon which the deformable layer 34 rests. The movable reflective layer 14 remains suspended over the cavity, as in FIGS. 7A-7C, but the deformable layer 34 does not form the support posts 18 by filling holes between the deformable layer 34 and the optical stack 16. Rather, the support posts 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the movable electrode is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Use of Dimples/Nanoparticles to Reduce Stiction

Stiction can be one of the most important reliability issues in microelectromechanical systems in general and interferometric modulator in particular. "Stiction," as used herein, refers to a tendency of a movable layer in an actuated position to stick to a stationary layer in a microelectromechanical system.

Stiction occurs when the total of adhesion forces between two layers is greater than a restoring force. Adhesion forces become more significant when decreasing device dimensions. Restoring forces, however, decrease with decreasing device sizes. Thus, stiction is an inherent reliability concern for microelectromechanical systems of small dimensions. Accordingly, there is a need to provide a solution to the stiction problem in microelectromechanical systems.

Adhesion forces may arise from several mechanisms such as, capillary forces, van der Waals interactions, chemical bonds, solid bridging, etc. Adhesion forces, including short range and long range adhesion forces, depend on contact area and surface separation between two layers. Short range adhesion forces may be decreased by decreasing contact area between contacting surfaces, e.g., by increasing an effective hardness and/or roughening the surfaces. Long-range adhesion forces may be decreased by increasing an average surface separation between two layers in the actuated or collapsed condition of the MEMS.

In one embodiment, an interferometric modulator has a movable reflective electrode assembly having dimples on a surface facing a fixed "transparent" electrode assembly. The term "transparent," as used herein, is meant to encompass partially transparent materials or structures. The dimples on the surface reduce contact area between the two electrodes. In addition, because the reflective electrode assembly surface has the dimples recessed into the electrode, an average surface separation between the transparent electrode assembly and the reflective electrode assembly is increased. Thus, both short and long range adhesion forces can be effectively reduced, thereby decreasing stiction between the electrodes.

In another embodiment, nanoparticles are partially embedded in the dimples of the reflective layer. When the nanoparticles are selected to be of a material harder than that of the reflective layer, this configuration increases an effective hardness of the reflective electrode, thus reducing contact area between the electrodes by reducing the layers' ability to conform to one another in the collapsed or actuated state. Therefore, short range adhesion forces can be effectively reduced. Furthermore, nanoparticles of a material with lower surface energy than the reflective layer material further decrease adhesion forces. In addition, nanoparticles with superior creep-resistance behavior compared to the reflective electrode can reduce creep of the reflective electrode.

Yet another embodiment of the invention provides an interferometric modulator having dimples on a reflective electrode assembly surface and nanoparticles on a transparent electrode assembly surface. This configuration also reduces contact area and increases surface separation between the electrodes, and thus reduces stiction between the electrodes. Furthermore, nanoparticles of a material with lower surface energy than the transparent material further decrease adhesion forces.

While illustrated in the context of optical MEMS devices, particularly interferometric modulators, the skilled artisan will appreciate that the reduced stiction between collapsed parts is advantageous for other MEMS devices, such as electromechanical switches.

Figure 8A:
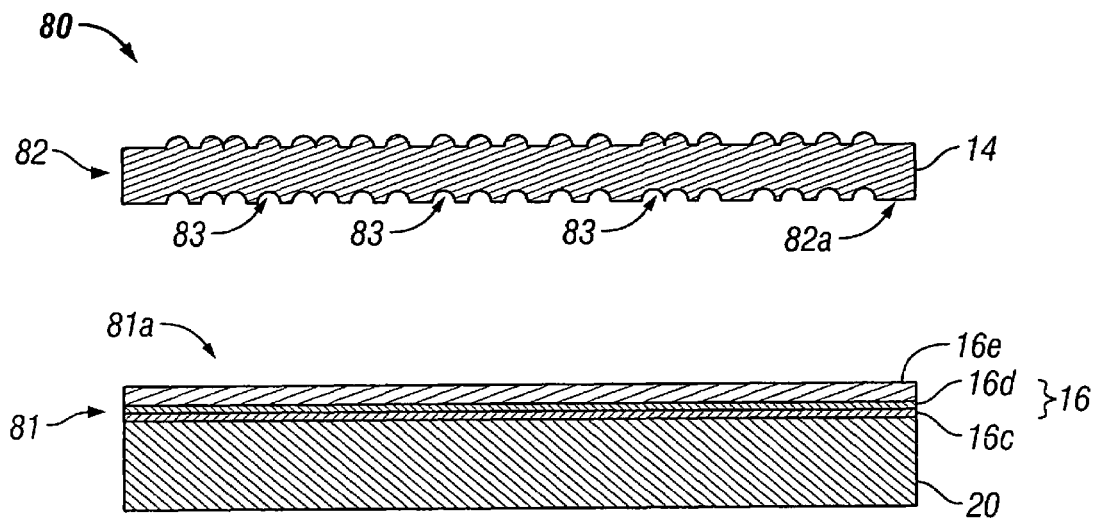
FIGS. 8A and 8B are cross sections of an embodiment of an interferometric modulator in relaxed and actuated positions, respectively.
Figure 8B:
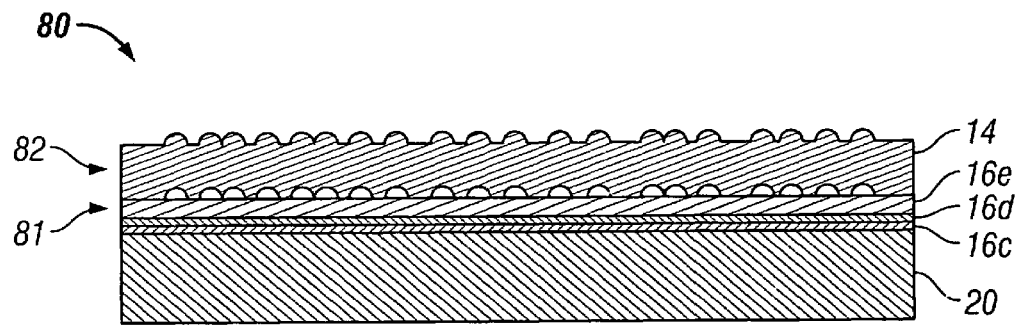

FIGS. 8A and 8B illustrate an interferometric modulator 80 according to an embodiment. The interferometric modulator 80 has a fixed electrode 81 (preferably at least partially transparent for the illustrated embodiment) and a movable electrode 82 (preferably reflective for the illustrated embodiment). The movable electrode 82 is configured to have dimples 83 on a surface 82a facing the stationary electrode 81. The dimples 83 reduce contact area and increase surface separation between the electrodes 81, 82, thereby reducing stiction between them.

FIG. 8A only partially illustrates the fixed electrode 81 and the movable electrode 82 of the interferometric modulator 80 in a relaxed position. In the relaxed position, the movable electrode 82 is at a relative large distance from the fixed electrode 81. The movable electrode 82 can move to an actuated position. In the actuated position, the electrode 82 is positioned more closely adjacent to the fixed electrode 81, and may be in contact with a top surface of the fixed electrode 81, as shown in FIG. 8B.

In FIG. 8A, support posts are not illustrated. However, it should be noted that various types of support posts, as shown in 7A-7E, can be employed. In certain embodiments, the reflective electrode 82 may be suspended from a deformable layer, as shown in FIGS. 7C-7E.

The illustrated fixed electrode 81 overlies a transparent substrate 20, and includes an indium tin oxide (ITO) layer 16c overlying the substrate 20, an absorber layer 16d overlying the ITO layer 16c, and a dielectric layer 16e overlying the absorber layer 16d. The absorber layer 16d is preferably formed of a semi-transparent thickness of metal, such as chromium. In another embodiment for a broad-band white interferometric modulator, the absorber layer 16d may be formed of a semiconductor layer, such as germanium. The dielectric layer 16e is preferably formed of silicon dioxide and/or aluminum oxide and serves to prevent the two electrodes from shorting during operation. In one embodiment, the dielectric layer may have a two-layered structure, including an upper layer and a lower layer (not shown). The upper layer may be formed of aluminum oxide that can serve as an etch stop layer, as will be better understood from the description below. The lower layer may be formed of silicon dioxide. In one embodiment, the ITO layer 16c may have a thickness between about 100 Å and about 800 Å. The absorber layer 16d may have a thickness between about 1 Å and about 50 Å, preferably between about 10 Å and about 40 Å, more preferably between about 25 Å and about 35 Å. The dielectric layer 16e may have a thickness between about 100 Å and about 1,600 Å. Together, the layers define an optical stack 16 or fixed electrode 81.

In the illustrated embodiment, the movable electrode 82 includes a reflective metal, preferably, Al, Au, Ag, or alloys of the foregoing. In certain embodiments where the MEMS device is used as an electromechanical switch, the movable electrode 82 may be formed of a conductor such as Cu, Pt, Ni, Au, Al, or alloys of the foregoing.

The movable electrode 82 has a plurality of dimples 83 on a surface 82a facing the fixed electrode 81. The dimples preferably have a diameter larger than an innate roughness of the dielectric layer or a sacrificial layer which will be described later in detail. The innate roughness is typically between about 10 Å RMS and about 50 Å RMS, and most often between about 15 Å RMS and about 30 Å RMS. However, the dimples should not be too large to cause scattering of light passing through the fixed electrode. In addition, the dimples should be small because it may create different optical path which may adversely affect the optical properties of the interferometric modulator. Preferably, the dimples have a diameter of between about 10 Å and about 500 Å, more preferably between about 30 Å and about 200 Å.

The dimple size and the areal coverage may be interdependently adjusted to optimally reduce stiction while minimizing interference with optical properties of the interferometric modulator 80. An areal coverage of the dimples may be selected roughly in inverse proportional to an average diameter of the dimples. Preferably, the dimples have an average diameter between about 10 Å and 500 Å, more preferably between about 30 Å and 200 Å. The dimples preferably cover between about 5% and 75% of the surface 82a of the movable electrode 82, more preferably between about 25% and about 50% of the surface 82a of the movable electrode 82. In one embodiment, the dimples 83 have an average diameter of about 10-30 Å and cover between about 5% and 50% of the surface 82a of the movable electrode 82. In another embodiment, the dimples 83 have an average diameter of about 300-500 Å and cover between about 5% and 75% of the surface 82a of the movable electrode 82. Generally, the dimples will have a distribution of sizes.

The dimples increase roughness of the movable electrode surface facing the fixed electrode. The dimples increase the roughness by providing irregularities on the surface. The relationship between a roughness of an electrode surface and a dimple radius may be expressed in Equation 1 below:

$$\text{Roughness (root mean square or RMS) of a modified surface} \sim \text{Roughness of an unmodified surface} + (p/4)*r*FF \quad \text{Equation 1}$$

In Equation 1, r is an average radius of dimples. FF is a fill factor which is an areal coverage of dimples (0.05<FF<0.75 for dimple coverage of 5% to 75%). Preferably, the dimples increase the roughness of the electrode surface by about 5 Å RMS to about 100 Å RMS, more preferably by about 10 Å RMS to about 50 Å RMS, relative to the innate roughness of the electrode surface. The resulting electrode surface may have an overall roughness of between about 20 Å RMS and about 130 Å RMS, preferably between about 25 Å RMS and about 80 Å RMS.

Similarly, the dimples increase an average surface separation between the electrode surfaces by providing recesses on the electrode surface. The relationship between an average surface separation and an average dimple radius may be expressed in Equation 2 below:

$$\text{Surface separation of a modified surface} \sim \text{surface separation of an unmodified surface} + (p/4)*r*FF \quad \text{Equation 2}$$

In Equation 2, r is an average radius of dimples. FF is a fill factor which is an areal coverage of dimples (0.05<FF<0.75 for dimple coverage of 5% to 75%). Preferably, the dimples increase the surface separation by about 5 Å to about 100 Å, more preferably by about 10 Å to about 50 Å.

FIG. 8B partially illustrates the interferometric modulator 80 in the actuated position. In the actuated position, the surface of the movable electrode 82 having dimples is in contact with a top surface of the fixed electrode 81. Because the surface 82a of the movable electrode 82 has dimples 83, contact area between the surfaces of the movable and fixed electrodes is reduced by the total area of the dimples 83. Thus, short range adhesion forces between the contacting surfaces of the electrodes decrease. In addition, because of the dimples 83, an average surface separation between the electrodes 81 and 82 increases compared with that of an unmodified interferometric modulator. Thus, long range adhesion forces are also reduced. These effects in combination significantly reduce stiction between the electrodes.

Figure 9A:
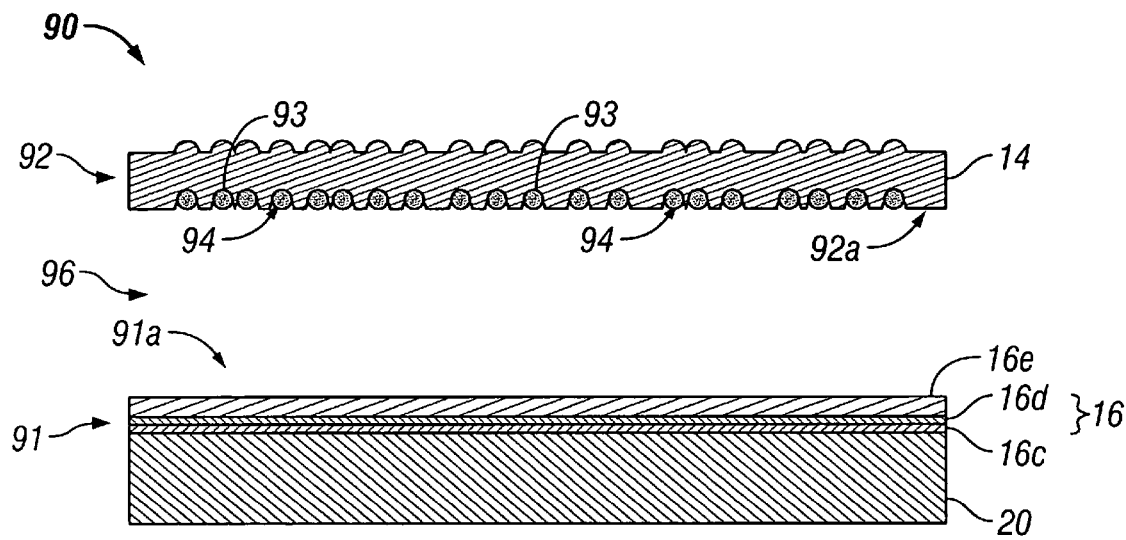
FIGS. 9A and 9B are cross sections of another embodiment of an interferometric modulator in relaxed and actuated positions, respectively.
Figure 9B:
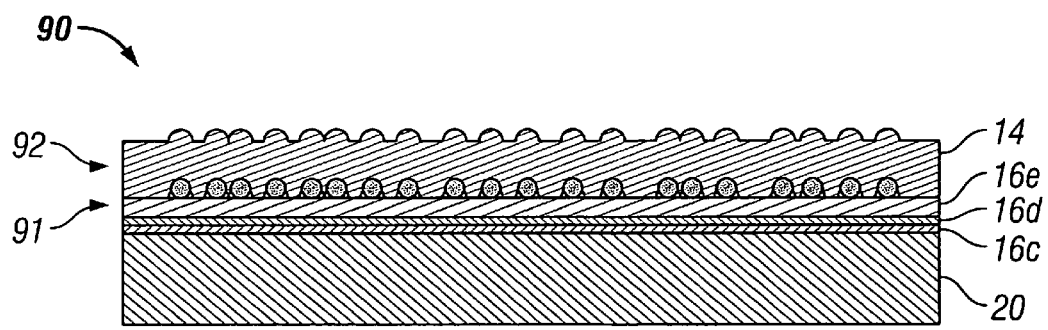

FIGS. 9A and 9B illustrate an interferometric modulator 90 according to another embodiment. FIG. 9A only partially illustrates a transparent fixed electrode 91 and a reflective movable electrode 92 of the interferometric modulator 90 in a relaxed position. The electrodes 91 and 92 can have a layer structure and material as described above with respect to the electrodes 81 and 82 of FIG. 8.

The interferometric modulator 90 has dimples 93 and nanoparticles 94 on a surface 92a of the movable electrode 92 to reduce stiction. The movable electrode 92 has dimples 93 on the surface 92a which faces the fixed electrode 91. The dimples 93 have an average diameter between about 10 Å and about 500 Å, preferably between about 30 Å and about 200 Å. The dimples 93 cover between about 5% and about 75% of the surface 92a of the reflective electrode 92.

The nanoparticles 94 are partially embedded in the dimples 93 of the reflective movable electrode 92. At least a portion of each nanoparticle is exposed to a cavity 96 between the electrodes 91 and 92, as shown in FIG. 9A. In one embodiment, the nanoparticles 94 are formed of a conductive material, preferably a metal which has a higher hardness than a material for the movable electrode 92. In the illustrated embodiment, the movable electrode 92 has a lower surface defined by aluminum, and the nanoparticles 94 are formed of aluminum oxide ($Al_2O_3$) which is harder than aluminum. The nanoparticles 94 have an average diameter between about 10 Å and about 500 Å, preferably between about 30 Å and about 200 Å, more preferably between about 50 Å and about 150 Å. Preferably, the nanoparticles have different sizes. In another embodiment, the nanoparticles are formed of a material having low surface energy of between about 0.02 Joules/$m^2$ and about 0.7 Joules/$m^2$. Examples of low surface energy materials include cadmium, indium, magnesium, cerium, tin, zinc, cesium oxide, calcium carbonate, gallium, bismuth oxide, barium fluoride, zirconium oxide, zinc oxide, barium sulfate, barium titanate, calcium chloride, and calcium oxide.

FIG. 9B illustrates the interferometric modulator 90 in an actuated position. In the actuated position, the movable electrode 92 is close to and typically in contact with the fixed electrode 91. The bottom surface 92a (FIG. 9A) of the movable electrode 92 is in contact with a top surface 91a (FIG. 9A) of the fixed electrode 91. Microscopically, however, the contact occurs mainly between the nanoparticles 94 and the top surface 91a of the fixed electrode 91. Therefore, contact area between the two electrodes 91 and 92 significantly decreases.

In addition, in the embodiment where the nanoparticles 93 have a higher hardness than the lower surface of the movable electrode 92, the nanoparticles may prevent local creep of the reflective layer at points of contact. "Creep," used herein, refers to material deformation which occurs as a result of long term exposure to localized high stress and/or high temperature. Deformation resulting from creep brings about an increase in contact area. In one embodiment, aluminum oxide nanoparticles may be used to prevent creep of an aluminum reflective layer. Because aluminum oxide has a higher hardness than aluminum, the nanoparticles, by being partially embedded in the reflective surface of the movable electrode, increase an effective hardness of the electrode surface. Thus, the electrode surface can resist localized high stress. This configuration prevents local creep, thereby preventing an increase in contact area. Other examples of hard and creep-resistant materials include magnesium, cerium, and zinc. Furthermore, in the embodiment where the nanoparticles are formed of a low surface energy material, as described above, the nanoparticles can form a solid lubricant to reduce stiction.

Figure 10A:
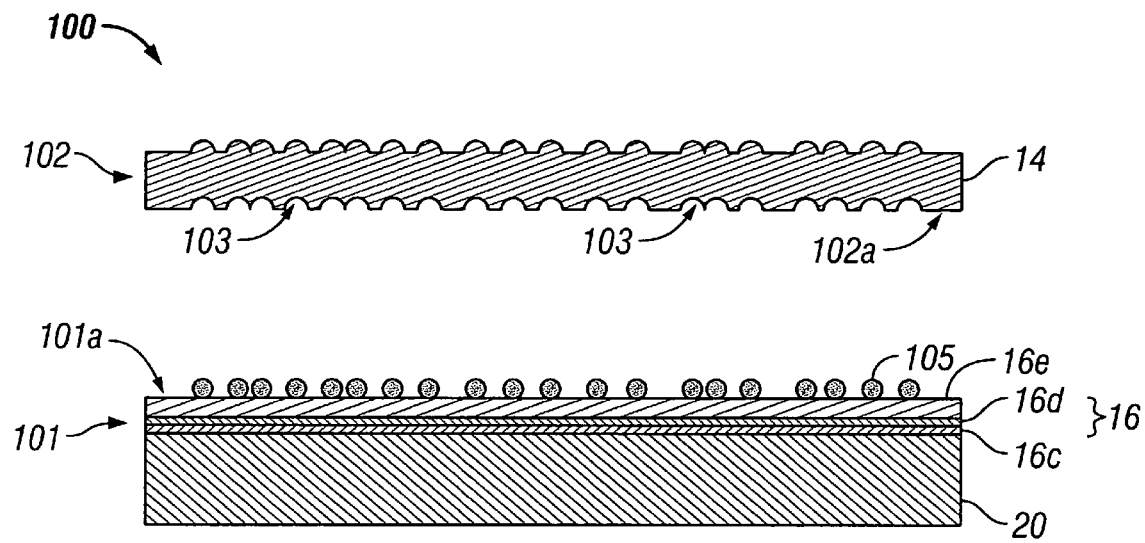
FIGS. 10A and 10B are cross sections of yet another embodiment of an interferometric modulator in relaxed and actuated positions, respectively.
Figure 10B:
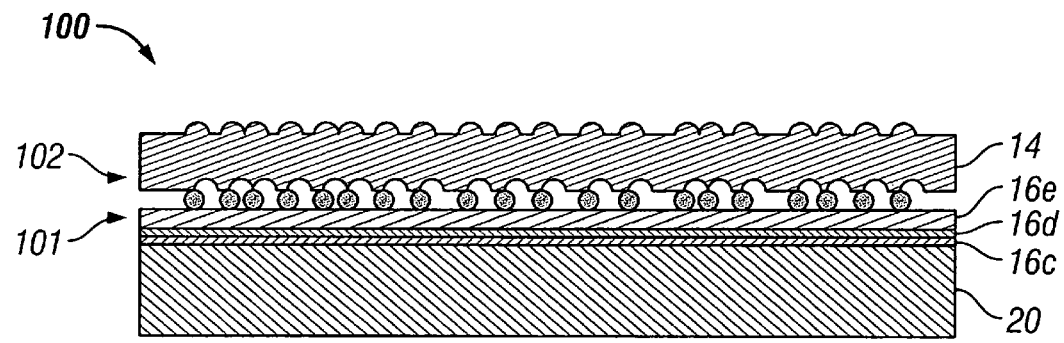

FIGS. 10A and 10B illustrate an interferometric modulator 100 according to another embodiment. The interferometric modulator 100 has nanoparticles 105 on a transparent fixed electrode 101 and dimples 103 on a reflective movable electrode 102. FIG. 10A partially illustrates the fixed electrode 101 and the movable electrode 102 of the interferometric modulator 100 in a relaxed position. The electrodes 101 and 102 can have the same general structure and material as described with respect to the electrodes 81 and 82 of FIG. 8.

The movable electrode 102 has dimples 103 on a surface 102a facing the fixed electrode 101. The dimples 103 of the movable electrode 102 may be similar in size and areal coverage to those of the movable electrode 82 of FIG. 8.

Figure 15A:
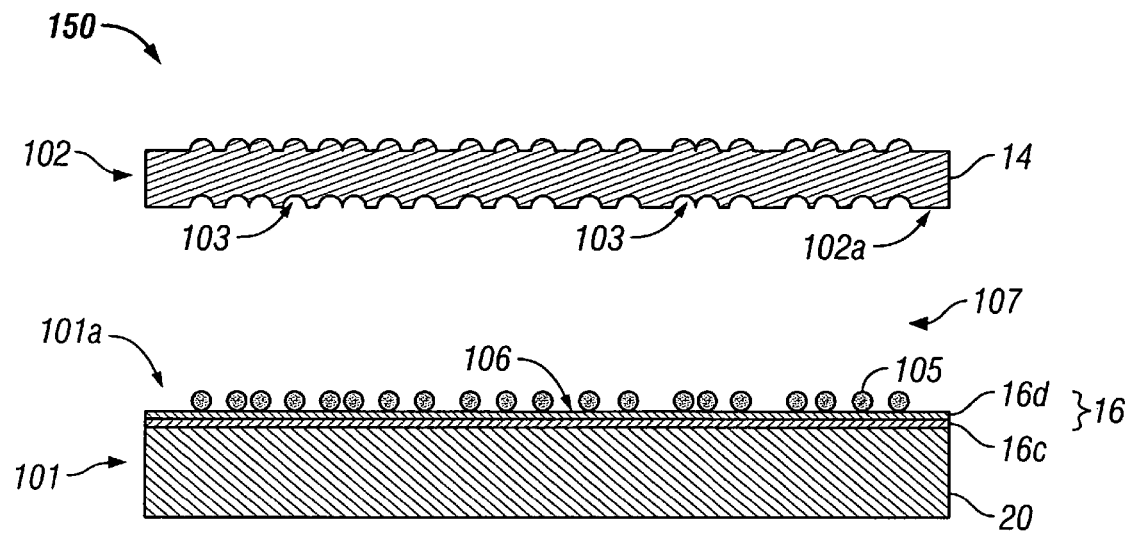
FIGS. 15A and 15B are cross sections of another embodiment of an interferometric modulator in relaxed and actuated positions, respectively.
Figure 15B:
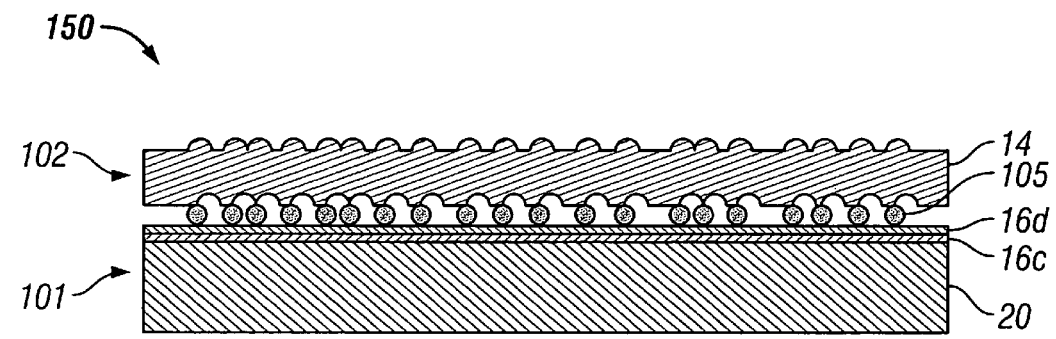

The fixed electrode 101 has nanoparticles 105 on its top surface 101a facing the movable electrode 102. The nanoparticles are preferably formed of a dielectric material. In certain embodiments, dielectric nanoparticles may replace the dielectric layer 16e and sit directly on a conductive surface of the fixed electrode 101. In this case, portions of the conductive surface not covered by the nanoparticles are exposed to the cavity, as shown in FIGS. 15A and 15B. The nanoparticles 105 may be formed of cadmium, indium, magnesium, cerium, tin, zinc, cesium oxide, calcium carbonate, gallium, bismuth oxide, barium fluoride, zirconium oxide, zinc oxide, barium sulfate, barium titanate, calcium chloride, or calcium oxide. The nanoparticles 105 have an average diameter between about 10 Å and about 500 Å, more preferably between about 30 Å and about 200 Å. The nanoparticles and dimples may increase roughness of the movable layer by about 5 Å RMS to about 100 Å RMS, more preferably by about 10 Å RMS to about 50 Å RMS relative to the innate roughness of the electrode surface. Preferably, the nanoparticles have non-uniform size distribution. In addition, the nanoparticles 104 cover between about 5% and about 75% of the top surface 101a of the fixed electrode 101. The nanoparticles are physically bonded to the top surface 101a of the fixed electrode 101.

FIG. 10B illustrates the interferometric modulator 100 in an actuated position. In the actuated position, the surface 102a of the movable electrode 102 having the dimples 103 is in contact with the surface 101a of the fixed electrode 101 having the nanoparticles 105.

The nanoparticles 105 are not all aligned with corresponding dimples 103 on the surface 102a of the movable electrode 102. In a process for making the interferometric modulator 100 which will be described later in detail, dimples 103 are formed in the movable electrode 102 by transferring shapes of the nanoparticles 105 through a deposited sacrificial layer into the movable electrode 102. However, the shapes and positions of the dimples are altered relative to the nanoparticles, depending upon the thickness and conformality of the sacrificial layer that transmits the shape of the nanoparticles. Furthermore, there is always some lateral displacement of the movable electrode 102, on a nanometer scale, when the movable electrode 102 is in the actuated position. Therefore, the nanoparticles 105 do not fit into the dimples 103 when the electrodes 101 and 102 are in contact with each other. Thus, the dimples 103 and the nanoparticles 105, in combination, produce a gap between the electrode surfaces in the actuated position.

The configuration described above thus significantly reduces stiction. The nanoparticles 105 and the dimples 103 decrease contact area between the surfaces of the electrodes 101 and 102 through surface roughening. In addition, they increase effective surface separation between the surfaces of the electrodes 101 and 102. Furthermore, nanoparticles formed of a low surface energy material may form a solid lubricant to reduce stiction.

In certain embodiments, a top surface of a stationary electrode may be configured to have a relatively low areal coverage of nanoparticles. The nanoparticles may cover between about 0.1% and 1% of the stationary electrode surface. This configuration allows a movable electrode to collapse in between adjacent nanoparticles, thus producing more strain energy in the movable electrode. The strain energy helps the reflective layer of the movable electrode overcome adhesion forces when the device is relaxed and break contact with the top surface of the fixed electrode.

In an unpictured embodiment, an interferometric modulator may have a reflective electrode assembly without dimples and a transparent electrode assembly with nanoparticles on a surface facing the reflective electrode assembly. The nanoparticles are preferably formed of a dielectric material. In certain embodiments, dielectric nanoparticles may replace a dielectric layer of the transparent electrode assembly. The nanoparticles may have an average diameter between about 10 Å and about 500 Å, preferably between about 50 Å and about 500 Å, more preferably, between about 30 Å and about 200 Å. Preferably, the nanoparticles have non-uniform size distribution. In addition, the nanoparticles cover between about 5% and about 75% of the surface of the transparent electrode assembly. In an actuated position, the nanoparticles, interposed between the surfaces of the electrodes, reduce actual contact area and increase surface separation, and thus reduce stiction. Furthermore, nanoparticles formed of a low surface energy material may form a solid lubricant to reduce stiction.

The interferometric modulators of the above embodiments are described by way of example. The dimples and nanoparticles in the embodiments may generally apply to microelectromechanical devices which have electrodes different from those of the embodiments. A skilled artisan will appreciate that electrode structures and configurations may be varied depending on the design of a given microelectromechanical device.

Method of Making Interferometric Modulator Using Nanoparticles

Figure 11A:
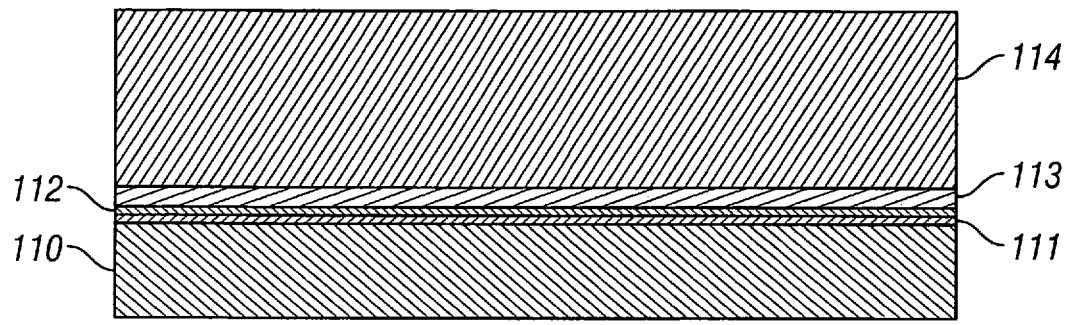
FIGS. 11A-11D illustrate a method of forming the interferometric modulator of FIG. 8 according to an embodiment.

FIGS. 11A-11D illustrate a method of making the interferometric modulator of FIG. 8 according to an embodiment. In FIG. 11A, an optical stack is provided over a transparent substrate 110. In the illustrated embodiment, the optical stack has a transparent conductor in the form of an ITO layer 111 overlying the substrate 110, an absorber layer 112 overlying the ITO layer 111, and a dielectric layer 113 overlying the absorber layer 112. The absorber layer 112 is preferably formed of chromium. In another embodiment for a broadband white interferometric modulator, the absorber layer 112 may be formed of a semiconductor layer, such as germanium. The dielectric layer 113 is preferably formed of silicon dioxide and/or aluminum oxide. The layers 111-113 may be as described with respect to the layers 16c-16e of FIG. 8. In certain embodiments, the dielectric layer 113 may include top and bottom layers. The bottom layer may be formed of silicon dioxide and the top layer may be formed of a different material, preferably aluminum oxide, to serve as an etch stop layer. A sacrificial layer 114 is provided over the dielectric layer 113. In the illustrated embodiment, the sacrificial layer 114 is formed of molybdenum. Other examples include silicon and tungsten. The thickness of the sacrificial layer 114 determines the size of the cavity or air gap in the final MEMS device, and controls the color reflected in the relaxed condition. Preferably, the sacrificial layer 114 has a thickness between about 100 nm and about 500 nm.

Figure 11B:
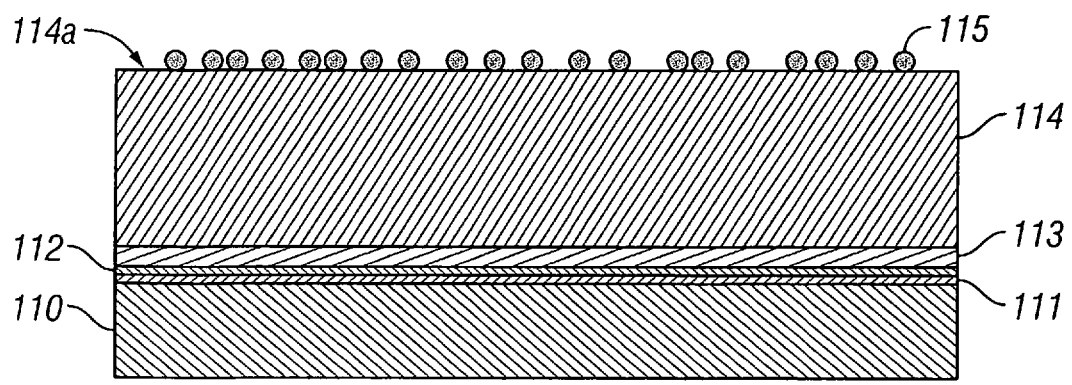

Next, as shown in FIG. 11B, nanoparticles 115 are provided on a top surface 114a of the sacrificial layer 114. The nanoparticles 115 are formed of a material etchable by an etchant which will be used to remove the sacrificial layer 114. A preferred etchant is a fluorine-based etchant, such as $XeF_2$. Examples of etchable nanoparticle material include molybdenum, silicon, tungsten, titanium, and tantalum. The nanoparticles 115 have an average diameter between about 10 Å and about 500 Å, preferably between about 30 Å and about 200 Å. The nanoparticles 115 preferably have non-uniform particle sizes.

In one embodiment, the nanoparticles 115 may be provided on the sacrificial layer 114 using a spin-on process. The nanoparticles are commercially available in a suspension form from Reade Advanced Materials. A uniform liquid layer containing the nanoparticles is applied onto the sacrificial layer 114 using a spin-on process. The liquid is then evaporated by any conventional process, leaving only the nanoparticles on the sacrificial layer 114. The spin-on process can be controlled to control an areal density of the nanoparticles. In addition, the nanoparticle concentration in the suspension can be adjusted to control the areal coverage of nanoparticles on the sacrificial layer surface.

Figure 11C:
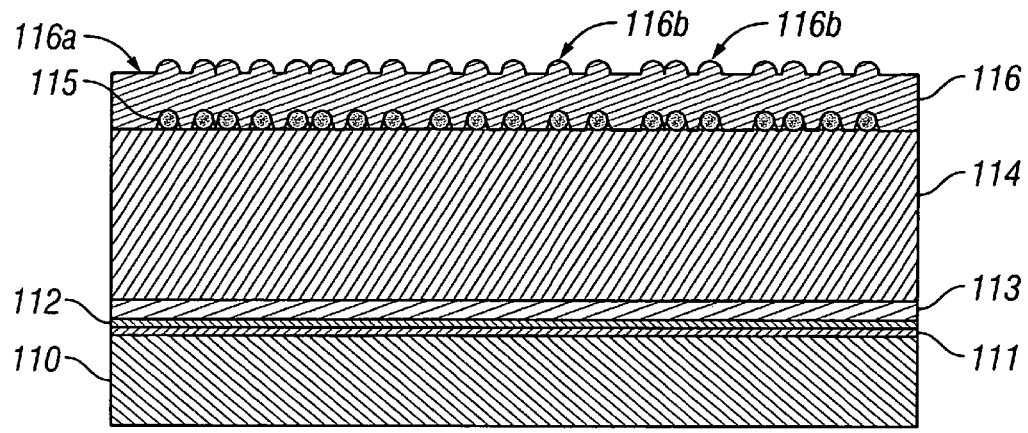

Subsequently, a movable electrode layer 116 is provided over the sacrificial layer 114 and the nanoparticles 115, as shown in FIG. 11C. The movable electrode layer 116 is preferably formed of a reflector. Examples of a reflector include Al, Au, Ag, and their alloys. In certain embodiments where the MEMS device is used as an electromechanical switch, the electrode layer may be formed of a conductor such as Cu, Pt, Ni, Au, Al, or alloys of the foregoing. Because the electrode layer 116 has been formed over the sacrificial layer 114 having the nanoparticles 115 on its surface, the electrode layer 116 has, on its top surface 116a, bumps 116b corresponding to the underlying nanoparticles 115. In certain embodiments, the bumps 116b can be removed by any suitable polishing or planarizing process, including deposition of a planarized layer thereover.

Next, the movable electrode layer 116 is patterned using a lithographic process, preferably photolithography, for defining the electrode or mirror. Subsequently, another photolithographic process is performed to pattern the sacrificial layer 114 (and optional second sacrificial layer over the patterned electrode 116) for providing openings for support posts. Then, a material for the support posts is deposited over exposed surfaces, including surfaces of the sacrificial layer and the movable electrode layer. The posts can be formed of a hard inorganic material (e.g., silicon oxide) or can be formed by a mechanical layer (e.g., Ni) deposited over the movable electrode 116, either fused to it (see FIG. 7A) or separated from it by a second sacrificial layer (see FIGS. 7C-7E).

FIG. 11C represents an "unreleased" MEMS, with a sacrificial layer still in place. This structure would include completed support post structures (not shown), as those shown in FIGS. 7A-7E.

As noted above, a mechanical or deformable layer for the movable electrode can be deposited over the movable electrode layer and the support posts. The mechanical layer is preferably formed of nickel.

As also noted above, a second sacrificial layer can be deposited over the movable electrode layer after patterning the movable electrode layer and before patterning the sacrificial layer for post vias. Then, the sacrificial layer is patterned, and support posts are formed. Subsequently or simultaneously, the layer of a deformable material is formed over the sacrificial layer and the support posts. An exemplary deformable material is nickel. This process can provide the deformable nickel layer 34 of FIGS. 7C-7E from which the reflective layer can be suspended.

Figure 11D:
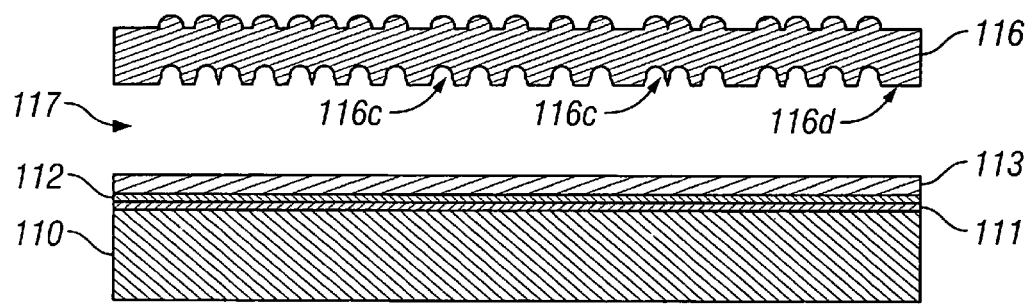

The sacrificial layer 114 is then selectively removed, leaving a cavity or gap 117 between the movable electrode layer 116 and the dielectric layer 113, as shown in FIG. 11D. This step is referred to as a "release" or "sacrificial etch" step. The sacrificial layer 114 which is formed of molybdenum is preferably etched using a fluorine-based etchant, such as $XeF_2$. At this step, the nanoparticles 115 are also etched by the etchant, leaving behind dimples 116c on a bottom surface 116d of the movable electrode layer 116. A resulting MEMS device, particularly an interferometric modulator, is shown in FIG. 11D. Although not shown, the completed released structure includes support structures similar to those shown in FIGS. 7A-7E. The released structure has a gap or cavity between the two electrodes.

Figure 12A:
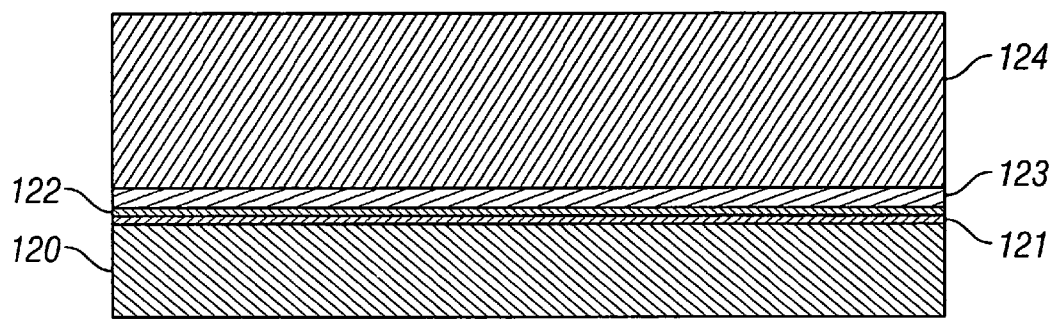
FIGS. 12A-12D illustrate a method of forming the interferometric modulator of FIG. 9 according to another embodiment.

FIGS. 12A-12D illustrate a method of making the interferometric modulator of FIG. 9 according to another embodiment. In FIG. 12A, an optical stack is provided over a transparent substrate 120. In the illustrated embodiment, the optical stack has a transparent conductor in the form of an ITO layer 121 overlying the substrate 120, an absorber layer 122 overlying the ITO layer 121, and a dielectric layer 123 overlying the absorber layer 122. The layers 121-123 can be as described for the material and thickness of the layers 111-113 of FIG. 11. A sacrificial layer 124 is provided over the dielectric layer 123, and is preferably formed of molybdenum. Other examples include silicon and tungsten.

Figure 12B:
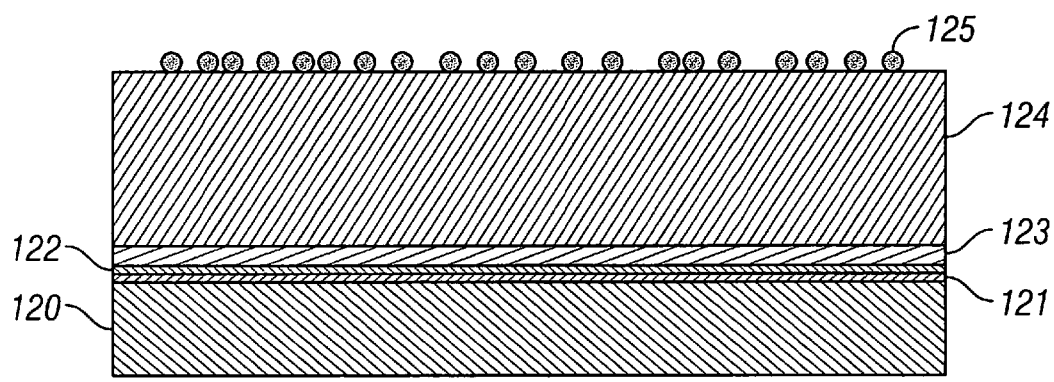

Next, as shown in FIG. 12B, nanoparticles 125 are provided over the sacrificial layer 124. The nanoparticles 125 are formed of a material not etchable by the etchant which will be used for removing the sacrificial layer 124. For example, where the sacrificial material is selected for removal by a fluorine-based etchant, such as $XeF_2$, the nanoparticles are selected to not be removable by exposure to the fluorine-based etchant. Some examples of nanoparticle materials include $SiO_2$, $Al_2O_3$, and $TiO_2$. In certain embodiments, the nanoparticles 125 may be formed of cadmium, indium, magnesium, cerium, tin, zinc, cesium oxide, calcium carbonate, gallium, bismuth oxide, barium fluoride, zirconium oxide, zinc oxide, barium sulfate, barium titanate, calcium chloride, or calcium oxide. The nanoparticles have an average diameter between about 10 Å and about 500 Å, preferably between about 30 Å and about 200 Å, more preferably, between about 50 Å and about 150 Å. The nanoparticles 125 preferably have non-uniform particle size distribution.

Figure 12C:
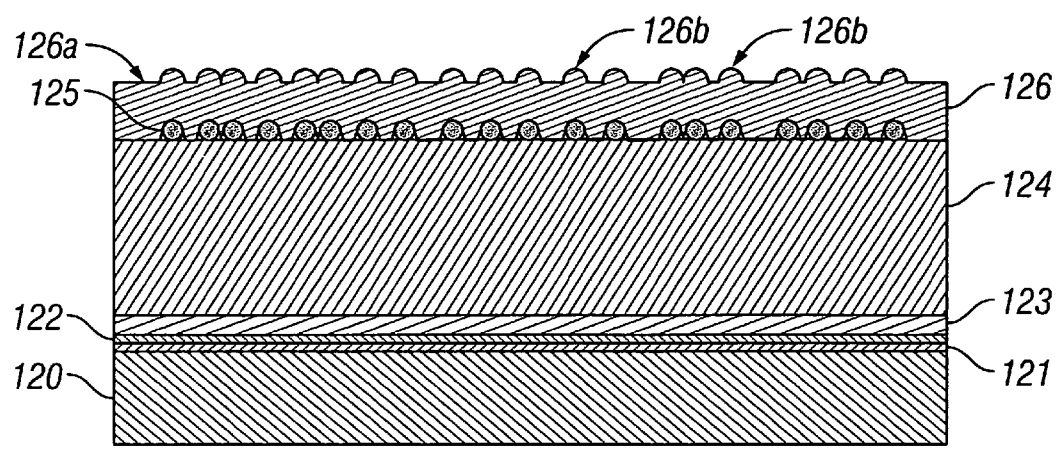

Subsequently, a movable electrode layer 126 is provided over the sacrificial layer 124 and the nanoparticles 125, as shown in FIG. 12C. The movable electrode layer preferably includes a reflector. Examples of a reflector include Al, Au, Ag, and alloys of the foregoing. In certain embodiments where the MEMS device is used as an electromechanical switch, the movable electrode layer may be formed of a conductor such as Cu, Pt, Ni, Au, Al, or alloys of the foregoing. In the illustrated optical MEMS embodiment, the movable electrode layer is formed of aluminum (Al). Because the movable electrode layer 126 has been formed over the sacrificial layer 124 having the nanoparticles 125 on its surface, the movable electrode layer 126 has, on its top surface 126a, bumps 126b corresponding to the underlying nanoparticles 125. In certain embodiments, the bumps 126b can be removed by a suitable polishing or planarizing process, including deposition of a planarized layer thereover.

In addition, additional steps for patterning the movable electrode layer 126 and forming support structures (not shown) are performed. Furthermore, a mechanical or deformable layer for the movable electrode may be provided as described above with reference to FIG. 11C. As noted above, FIG. 12C represents an unreleased structure which includes support posts (not shown). The structure may have various options such as a separate movable electrode fused or tethered to the support posts or a movable electrode connected through a second sacrificial layer to a deformable layer, as shown in FIGS. 7A-7E.

Figure 12D:
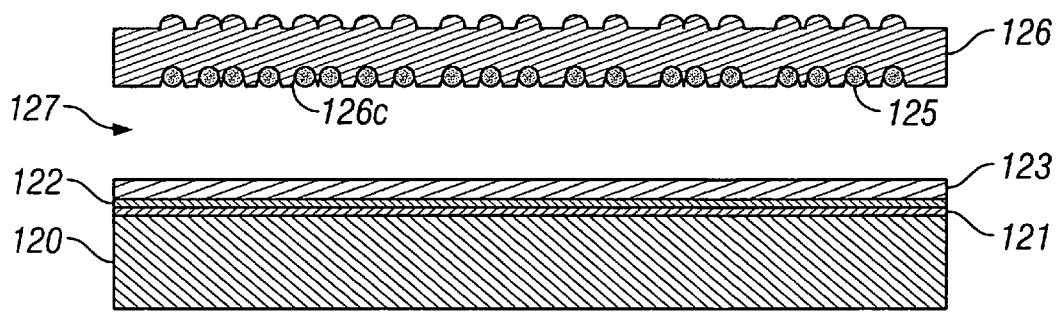

The sacrificial layer 124 is then removed, leaving a cavity or gap 127 between the reflective layer 126 and the dielectric layer 123, as shown in FIG. 12D. The sacrificial layer 124 which is formed of molybdenum in the illustrated embodiment, is preferably etched using a fluorine-based etchant, such as $XeF_2$. At this step, the nanoparticles 125 are not etched by the etchant, leaving the nanoparticles 125 in the dimples 126c of the reflective layer 126. The nanoparticles 125 are partially embedded in the dimples 126c; typically at least a portion of each nanoparticle is exposed to the cavity 127 between the movable electrode layer 126 and the dielectric layer 123. A resulting MEMS device, particularly an interferometric modulator, is shown in FIG. 12D. Although unpictured, the released structure include support post structures similar to those shown in FIGS. 7A-7E.

Figure 13A:
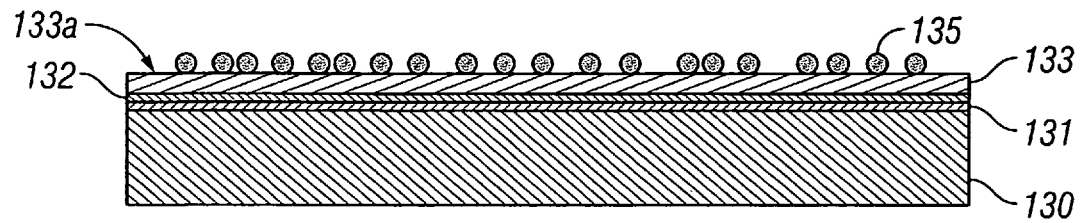
FIGS. 13A-13D illustrate a method of forming an interferometric modulator similar to that of FIG. 8 according to yet another embodiment.

FIGS. 13A-13D illustrate a method of making an interferometric modulator similar to that of FIG. 8 according to another embodiment. With reference to FIG. 13A, an optical stack is provided over a transparent substrate 130. In the illustrated embodiment, the optical stack has a transparent conductor in the form of an ITO layer 131 overlying the substrate 130, an absorber layer 132 overlying the ITO layer 131, and a dielectric layer 133 overlying the absorber layer 132. The layers 131-133 can be as described above with respect to the material and thickness of the layers 111-113 of FIG. 11. As shown in FIG. 13A, nanoparticles 135 are provided on a top surface 133a of the dielectric layer 133, using a spin-on process. The nanoparticles are formed of a material etchable by an etchant, for example, a fluorine-based etchant such as $XeF_2$, which will be later used for removing a sacrificial layer 134 (FIG. 13B), as noted with respect to the embodiments of FIGS. 11A-11D. The nanoparticles 135 have an average diameter between about 10 Å and about 500 Å, preferably between about 30 Å and about 200 Å.

Figure 13B:
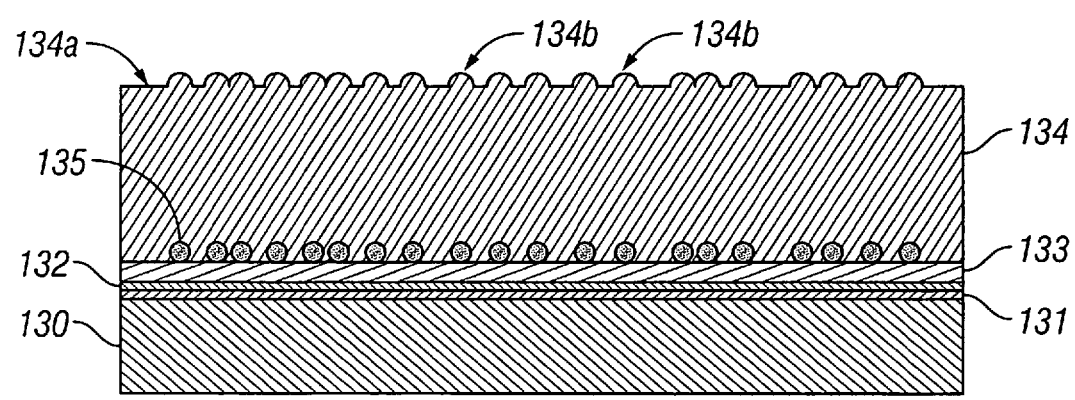

Subsequently, the sacrificial layer 134 is provided over the dielectric layer 133 and the nanoparticles 135, as shown in FIG. 13B. The sacrificial layer 134 is preferably formed of molybdenum. A thickness of the sacrificial layer 134 is selected for color, preferably between 100 nm and 500 nm. Because the sacrificial layer 134 has been formed over the dielectric layer 133 having the nanoparticles 135 on its surface, the sacrificial layer 135 has, on its top surface 134a, bumps 134b corresponding to the underlying nanoparticles 135.

Figure 13C:
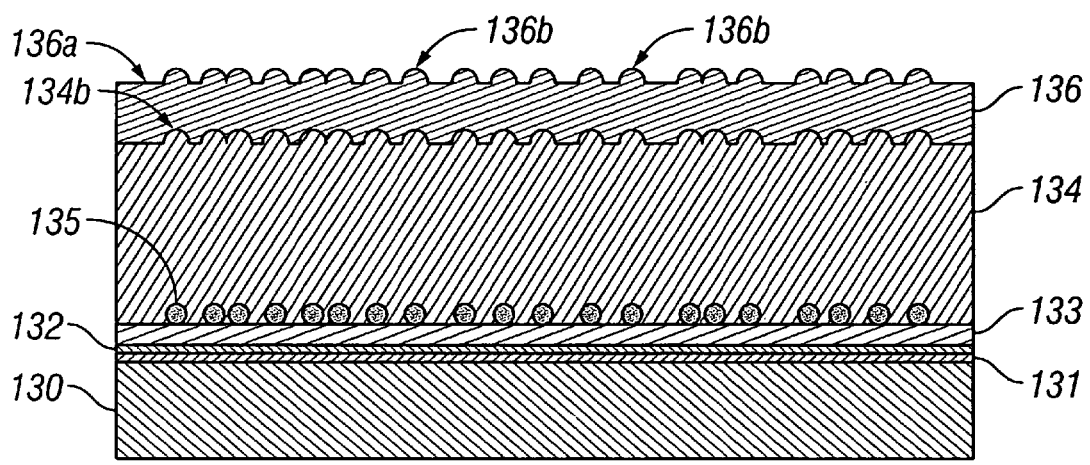

A movable electrode layer 136 is next provided over the sacrificial layer 134, as shown in FIG. 13C. In the illustrated embodiment, the movable electrode layer 136 is preferably formed of a reflective material, such as aluminum. In other embodiment, the movable electrode layer 136 may be formed of Au, Ag, Cu, Pt, Ni, or alloys of the foregoing. Because the movable electrode layer 136 is formed over the sacrificial layer 134 having the bumps 134b, corresponding bumps 136b are formed on a top surface 136a of the movable electrode layer 136. The bumps 136b of the movable electrode layer 136 corresponds in position to the underlying sacrificial layer bumps 134b and nanoparticles 135. In certain embodiments, the bumps 136b can be planarized by a suitable process, such as polishing or deposition of a planarized layer.

In addition, additional steps for patterning the movable electrode layer 136 and forming support structures (not shown) are performed. Furthermore, a mechanical or deformable layer for the movable electrode may be provided as described above with reference to FIG. 11C. As noted above, FIG. 13C represents an unreleased structure which includes support posts (not shown). The unreleased structure may have various options such as a fused or tethered movable electrode or a separate deformable mechanical layer 34, as shown in FIGS. 7C-7E.

Figure 13D:
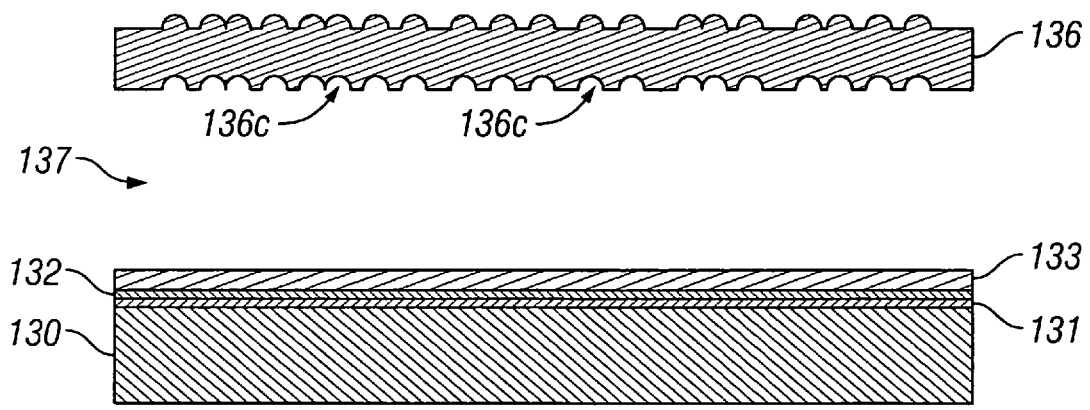

The sacrificial layer 134 is then removed, as shown in FIG. 13D, leaving a cavity 137 between the reflective layer 136 and the dielectric layer 133. The illustrated sacrificial layer 134, which is formed of molybdenum, is preferably etched using a fluorine-based etchant, such as $XeF_2$. At this step, the nanoparticles 135 are also etched by the etchant, leaving behind dimples 136c on a surface of the movable electrode layer 136 which faces the dielectric layer 133. A resulting MEMS device, particularly an interferometric modulator, is shown in FIG. 13D.

Figure 14A:
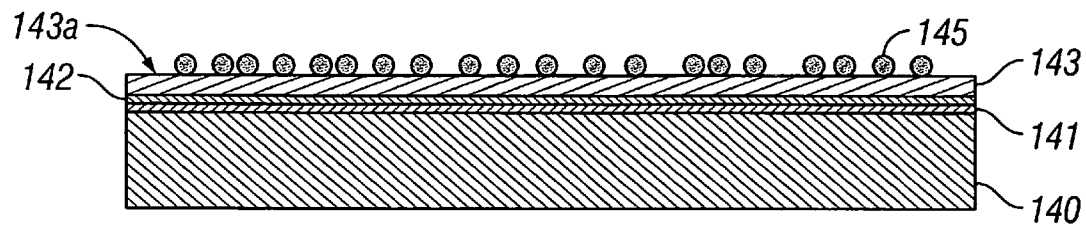
FIGS. 14A-14D illustrate a method of forming the interferometric modulator of FIG. 10 according to yet another embodiment.

FIGS. 14A-14D illustrate a method of making the interferometric modulator of FIG. 10 according to another embodiment. With reference to FIG. 14A, an optical stack is provided over a transparent substrate 140. In the illustrated embodiment, the optical stack has a transparent conductor in the form of an ITO layer 141 overlying the substrate 140, an absorber layer 142 overlying the ITO layer 141, and a dielectric layer 143 overlying the absorber layer 142. The layers 141-143 can be as described with respect to the material and thickness of the layers 111-113 of FIG. 11. As shown in FIG. 14A, nanoparticles 145 are provided on a top surface 143a of the dielectric layer 143, using a spin-on process. The nanoparticles are formed of a material which is not etchable by the etchant, which will be used for removing a sacrificial layer. For example, as described above with reference to FIGS. 11A-11D, if the sacrificial layer to be formed can be etched by a fluorine-based etchant, such as $XeF_2$, the nanoparticles are selected to resist such etch. Examples of such nanoparticles include $SiO_2$, $Al_2O_3$, and $TiO_2$. In certain embodiments, the nanoparticles 125 may be formed of cadmium, indium, magnesium, cerium, tin, zinc, cesium oxide, calcium carbonate, gallium, bismuth oxide, barium fluoride, zirconium oxide, zinc oxide, barium sulfate, barium titanate, calcium chloride, or calcium oxide. The nanoparticles 145 have an average diameter between about 10 Å and about 500 Å, preferably between about 30 Å and about 200 Å.

Figure 14B:
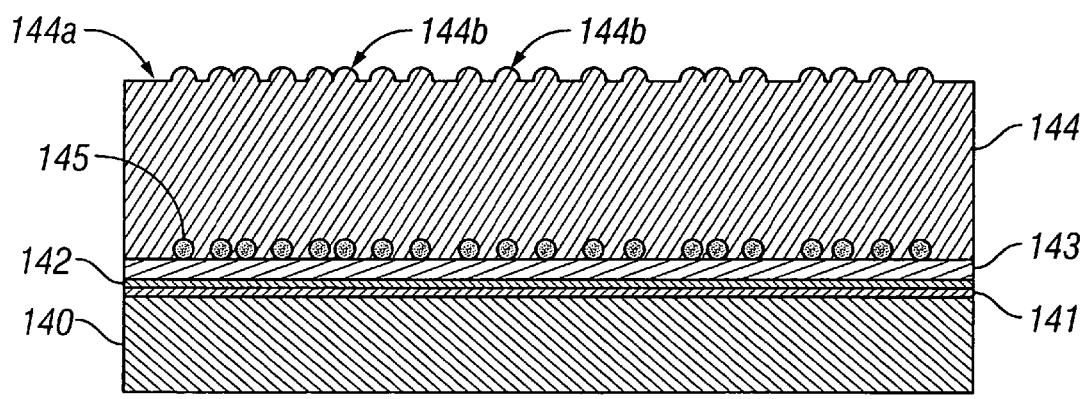

Subsequently, a sacrificial layer 144 is provided over the dielectric layer 143 and the nanoparticles 145, as shown in FIG. 14B. The sacrificial layer 144 is preferably formed of molybdenum, silicon or tungsten, which can be selectively etched by a fluorine-based etchant relative to other materials (the electrodes, the dielectric layer, the support posts) that define the cavity. Because the sacrificial layer 144 has been formed over the dielectric layer 143 having the nanoparticles 145 on its top surface, the sacrificial layer 145 has, on its top surface 144a, bumps 144b which correspond to the underlying nanoparticles 145.

Figure 14C:
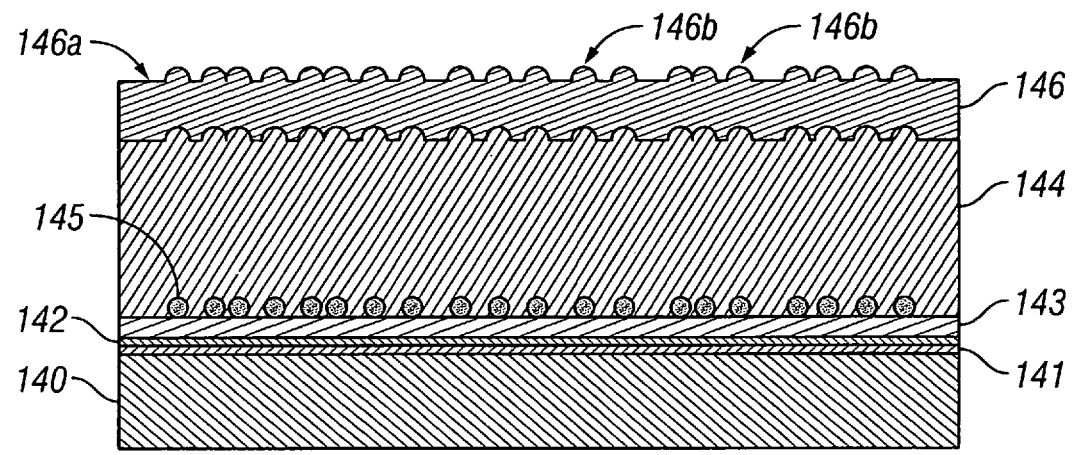

A movable electrode layer 146 is next provided over the sacrificial layer 144, as shown in FIG. 14C. The movable electrode layer 146 preferably includes a reflective layer such as aluminum. In other embodiments, the movable electrode layer 146 may be formed of Au, Ag, Cu, Pt, Ni, or alloys of the foregoing. Because the movable electrode layer 146 has been formed over the sacrificial layer 144 having the bumps 144b on its top surface, the movable electrode 146 also has, on its top surface 146a, bumps 146b corresponding to the sacrificial layer bumps 144b. In certain embodiments, the bumps 146b may be removed by any suitable polishing or planarizing process.

In addition, additional steps for patterning the movable electrode layer 146 and forming support structures (not shown) are performed. Furthermore, a mechanical or deformable layer for the movable electrode may be provided as described above with reference to FIGS. 7C-7E and 11C. As noted above, FIG. 14C represents an unreleased structure which includes support structures (not shown). The unreleased structure may have various options such as a fused or tethered movable electrode and a separate deformable mechanical layer 34, as shown in FIGS. 7C-7E.

Figure 14D:
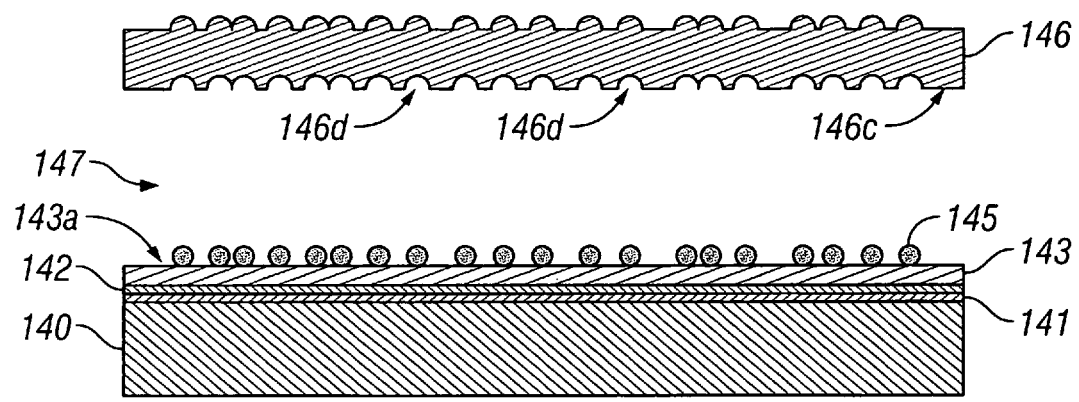

The sacrificial layer 144 is then removed, as shown in FIG. 14D, leaving a cavity or gap 147 between the movable electrode layer 146 and the dielectric layer 143. The sacrificial layer 144 in the illustrated embodiment is formed of molybdenum and is selectively etched using a fluorine-based etchant, such as $XeF_2$. As a result, dimples 146d are formed on a surface 146c facing the cavity 147. At this step, the nanoparticles 145 are not etched by the etchant, and thus remain intact on the top surface 143a of the dielectric layer 143.

In forming the dimples 146d, using the thick sacrificial layer 144, shapes of the nanoparticles 145 are not faithfully transferred into the reflective layer 146. The shapes and positions of the dimples are altered relative to the nanoparticles, depending upon the thickness and conformality of the sacrificial layer that transmits the shape of the nanoparticles. Furthermore, actuation inherently causes some lateral displacement as the mechanical layer deforms. Thus, the nanoparticles 145, when the movable electrode layer 146 is in an actuated position, are not all aligned with the dimples 146d of the movable electrode layer 146 as explained above with reference to FIG. 10.

In another embodiment, the bumps on the sacrificial layer may be planarized before providing the reflective layer over the sacrificial layer. For example, the bumps may be removed by any suitable polishing process or the sacrificial layer may be a planar layer which does not replicate the bumps. Next, the reflective layer is formed over the planarized sacrificial layer and then the sacrificial layer is removed. This process results in no dimples in the reflective layer. However, because the nanoparticles are not etchable by the sacrificial layer etchant, they remain on the dielectric layer surface. The resulting interferometric modulator has nanoparticles on its transparent electrode assembly, but no dimples on its reflective electrode assembly.

In yet another embodiment, the dielectric layer of the optical stack may be omitted, as shown in FIGS. 15A and 15B. In such an embodiment, dielectric nanoparticles 105 not etchable by a fluorine-based etchant are provided on a top surface of the absorber layer 16d which is preferably formed of a conductive material (e.g., Cr). In the resulting interferometric modulator 150, the nanoparticles 105 sit directly on the absorber layer 16d of the fixed electrode 101, as shown in FIGS. 15A and 15B. In this case, portions 106 of the absorber layer surface not covered by the nanoparticles 105 are exposed to a cavity 107 between the fixed electrode 101 and the movable electrode 102.

It should be noted that the embodiments described above are applicable to an interferometric modulator structure viewed from the opposite side, compared to that shown in FIG. 1. Such a configuration has a reflective electrode closer to the substrate (which needs not be transparent) and a semi-transparent electrode farther from the substrate. Either or both electrodes could be made movable. In addition, although not shown, it should be noted that the embodiments of FIG. 8-14 may be combined with options of the embodiments described above with reference to FIGS. 1-7.

The above-described modifications can lead to a more robust design and fabrication. Additionally, while the above aspects have been described in terms of selected embodiments of the interferometric modulator, one of skill in the art will appreciate that many different embodiments of interferometric modulators may benefit from the above aspects. Of course, as will be appreciated by one of skill in the art, additional alternative embodiments of the interferometric modulator can also be employed. The various layers of interferometric modulators can be made from a wide variety of conductive and non-conductive materials that are generally well known in the art of semi-conductor and electro-mechanical device fabrication.

In addition, the embodiments, although described with respect to an interferometric modulator, are applicable more generally to other MEMS devices, particularly electrostatic MEMS with electrodes capable of relative movement, and can prevent stiction in an actuated or collapsed position.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making an optical microelectromechanical system (MEMS) device, comprising:
    forming a first electrode of the optical microelectromechanical system device;
    providing a dielectric layer over the first electrode;
    providing a sacrificial layer over the dielectric layer;
    forming a second electrode over the sacrificial layer;
    removing the sacrificial layer after forming the second electrode;
    providing a plurality of pre-formed particles; and
    depositing the plurality of pre-formed particles on the sacrificial layer after providing the plurality of pre-formed particles, after providing the sacrificial layer and before forming the second electrode, wherein the plurality of pre-formed particles have a diameter between about 10 Å and about 500 Å,
    wherein forming the second electrode comprises transferring a texture from the pre-formed particles on the sacrificial layer into a surface of the second electrode deposited over the sacrificial layer.

2. The method of claim 1, wherein removing the sacrificial layer further comprises removing the plurality of pre-formed particles.

3. The method of claim 1, wherein the plurality of pre-formed particles are not removed during the step of removing the sacrificial layer.

4. The method of claim 1, wherein depositing the plurality of pre-formed particles comprises using a spin-on process.

5. The method of claim 1, wherein the second electrode comprises aluminum and wherein the plurality of pre-formed particles comprise $Al_2O_3$.

6. The method of claim 1, wherein the sacrificial layer comprises a material selected from the group consisting of molybdenum, silicon, and tungsten and wherein removing the sacrificial layer comprises using an etchant comprising fluorine.

7. The method of claim 6, wherein the plurality of pre-formed particles are etchable by the etchant.

8. The method of claim 6, wherein the plurality of pre-formed particles are not etchable by the etchant.

9. A method of making an optical microelectromechanical system (MEMS) device, comprising:
    forming a first electrode of the optical microelectromechanical system device;
    providing a dielectric layer over the first electrode;
    providing a plurality of pre-formed particles;
    depositing the plurality of pre-formed particles on the dielectric layer after providing the plurality of pre-formed particles, wherein the plurality of pre-formed particles have a diameter between about 10 Å and about 500 Å;
    providing a sacrificial layer over the dielectric layer and the plurality of pre-formed particles such that a top surface of the sacrificial layer includes bumps at positions above the plurality of pre-formed particles;
    forming a second electrode over the sacrificial layer; and
    removing the sacrificial layer after forming the second electrode.

10. The method of claim 9, wherein removing the sacrificial layer further comprises removing the plurality of pre-formed particles.

11. The method of claim 9, wherein the plurality of pre-formed particles are not removed during the step of removing the sacrificial layer.

12. A method of making an optical microelectromechanical system (MEMS) device, comprising:
    forming a first at least partially transparent electrode;
    providing a dielectric layer over the first electrode;
    providing a sacrificial layer over the dielectric layer;
    forming a second reflective electrode over the sacrificial layer;
    providing a liquid containing a plurality of pre-formed nanoparticles;
    dispensing the liquid with the nanoparticles over the dielectric layer after providing the dielectric layer and before forming the second electrode; and
    removing the liquid from over the dielectric layer to leave the nanoparticles over the dielectric layer without forming a continuous layer from the liquid;
    wherein forming the second reflective electrode comprises transferring a texture formed by the nanoparticles left over the dielectric layer into a surface of the second reflective electrode formed over the sacrificial layer.

13. The method of claim 12, wherein dispensing the liquid comprises dispensing the liquid on the sacrificial layer.

14. The method of claim 12, wherein dispensing the liquid comprises dispensing the liquid on the dielectric layer.

15. The method of claim 12, further comprising removing the sacrificial layer.

16. The method of claim 12, wherein the plurality of nanoparticles have an average diameter between about 10 Å and about 500 Å.

17. An interferometric modulator made by the method of claim 12.

* * * * *

UNITED STATES PATENT AND TRADEMARK OFFICE
CERTIFICATE OF CORRECTION

PATENT NO. : 7,711,239 B2
APPLICATION NO. : 11/407730
DATED : May 4, 2010
INVENTOR(S) : Teruo Sasagawa and Lior Kogut It is certified that error appears in the above-identified patent and that said Letters Patent is hereby corrected as shown below:

On the Title Page

At page 3, line 60, Item (56) under U.S. Patent Documents, after "Coleman, Jr." insert --, deceased-- therefor.

At page 6, line 54, Item (56) under Other Publications, change "Microclectromechanical" to --Microelectromechanical-- therefor.

At page 6, line 61, Item (56) under Other Publications, change "8327" to --B327-- therefor.

At page 6, line 67, Item (56) under Other Publications, change "Microenglneering" to --Microengineering-- therefor.

At page 7, line 2, Item (56) under Other Publications, change "Intematioal" to --International-- therefor.

At page 7, line 20, Item (56) under Other Publications, change "http:www." to --http://www.-- therefor.

Signed and Sealed this

Twelfth Day of October, 2010

David J. Kappos
*Director of the United States Patent and Trademark Office*

CERTIFICATE OF CORRECTION (continued)
U.S. Pat. No. 7,711,239 B2

Please incorporate the below listed references cited by the Information Disclosure Statement (IDS) dated 08/19/2008 in the Issued Patent (under Item (56) U.S. Patent Documents or Other Publications).

| | | |
|---|---|---|
| 6,104,525 | 8/2000 | Min |
| 6,704,475 | 3/2004 | Jin et al. |
| 6,778,728 | 8/2004 | Taylor |
| 7,042,619 | 5/2006 | McGinley et al. |
| 2002/0141690 | 10/2002 | Jin et al. |
| 2004/0226909 | 11/2004 | Tzeng |
| 2008/0144163 | 6/2008 | Floyd |

Lee ET AL., "Improvement of the surface characteristics of sputtered metal layer for a MEMS micro-mirror switch," Thin Solid Films, vol. 447, January 30, 2004, pp. 615-618. IPRP for PCT/US07/009267, filed April 12, 2007, Docket No. QCO.060VPC